(12) United States Patent
Kohmura et al.

(10) Patent No.: US 10,488,751 B2
(45) Date of Patent: Nov. 26, 2019

(54) PELLICLE, PRODUCTION METHOD THEREOF, EXPOSURE METHOD

(71) Applicant: MITSUI CHEMICALS, INC., Minato-ku, Tokyo (JP)

(72) Inventors: Kazuo Kohmura, Chiba (JP); Daiki Taneichi, Otake (JP); Yosuke Ono, Sodegaura (JP); Hisako Ishikawa, Ichihara (JP); Tsuneaki Biyajima, Otake (JP); Atsushi Okubo, Tokyo (JP); Yasuyuki Sato, Ibara (JP); Toshiaki Hirota, Ibara (JP)

(73) Assignee: MITSUI CHEMICALS, INC., Minato-Ku, Tokyo (JP)

( * ) Notice: Subject to any disclaimer, the term of this patent is extended or adjusted under 35 U.S.C. 154(b) by 0 days.

(21) Appl. No.: 15/454,555

(22) Filed: Mar. 9, 2017

(65) Prior Publication Data
US 2017/0184956 A1    Jun. 29, 2017

Related U.S. Application Data

(63) Continuation of application No. PCT/JP2015/076568, filed on Sep. 17, 2015.

(30) Foreign Application Priority Data

Sep. 19, 2014 (JP) ................. 2014-191930
Nov. 17, 2014 (JP) ................. 2014-233128

(51) Int. Cl.
*G03F 1/64* (2012.01)
*G03F 1/62* (2012.01)
(Continued)

(52) U.S. Cl.
CPC ................. *G03F 1/64* (2013.01); *G03F 1/62* (2013.01); *G03F 1/68* (2013.01); *G03F 7/2008* (2013.01); *H01L 21/027* (2013.01)

(58) Field of Classification Search
CPC ..... G03F 1/64; G03F 1/68; G03F 1/62; G03F 1/14; G03F 1/142; G03F 7/2008; H01L 21/027
See application file for complete search history.

(56) References Cited

U.S. PATENT DOCUMENTS 5,601,955 A * 2/1997 Fujita ................. G03F 1/64
428/14
6,300,019 B1  10/2001 Ikeda et al.
(Continued)

FOREIGN PATENT DOCUMENTS

CN    101354527 A     1/2009
CN    101930164 A    12/2010
(Continued)

OTHER PUBLICATIONS

Machine translation of JP 60-147737 (Mar. 1985).*
(Continued)

*Primary Examiner* — Martin J Angebranndt
(74) *Attorney, Agent, or Firm* — Buchanan, Ingersoll & Rooney PC

(57) ABSTRACT

Provided are a pellicle for extreme ultraviolet light lithography, a production method thereof, and an exposure method. A pellicle according to the present invention includes a first frame having a pellicle film located thereon; a second frame including a thick portion including a first surface carrying a surface of the first frame opposite to a surface on which the pellicle film is located, and also including a second surface connected with the first surface and carrying a side surface of the first frame, the second frame enclosing the pellicle film and the first frame; a through-hole provided in the thick portion of the second frame; and a filter located on an outer side surface of the second frame and covering the through-hole, the outer side (Continued)

surface crossing the surface of the first frame on which the pellicle film is located.

15 Claims, 17 Drawing Sheets

(51) Int. Cl.
 *G03F 1/68* (2012.01)
 *G03F 7/20* (2006.01)
 *H01L 21/027* (2006.01)

(56) References Cited

U.S. PATENT DOCUMENTS

| | | | |
|---|---|---|---|
| 6,593,035 B1 | 7/2003 | Levinson et al. | |
| 9,703,187 B2 * | 7/2017 | Ono | G03F 1/24 |
| 2003/0095245 A1 | 5/2003 | Mishiro et al. | |
| 2003/0207182 A1 | 11/2003 | Shirasaki | |
| 2005/0042524 A1 | 2/2005 | Bellman | |
| 2008/0213679 A1 | 9/2008 | Miyakawa et al. | |
| 2008/0259291 A1 * | 10/2008 | Banine | G03F 7/70191 355/30 |
| 2009/0029268 A1 | 1/2009 | Lin et al. | |
| 2009/0274962 A1 | 11/2009 | Kubota et al. | |
| 2009/0291372 A1 | 11/2009 | Kubota et al. | |
| 2010/0323281 A1 | 12/2010 | Sekihara | |
| 2010/0328635 A1 | 12/2010 | Sekihara | |
| 2011/0207030 A1 | 8/2011 | Shirasaki et al. | |
| 2012/0107548 A1 | 5/2012 | Sekihara | |
| 2013/0088699 A1 | 4/2013 | Yakunin et al. | |
| 2013/0089814 A1 | 4/2013 | Kim et al. | |
| 2014/0065525 A1 * | 3/2014 | Yamada | G03F 1/142 430/5 |
| 2014/0106265 A1 | 4/2014 | Sekihara | |
| 2014/0234756 A1 | 8/2014 | Kinoshita | |
| 2014/0307237 A1 * | 10/2014 | Sekihara | C23C 4/08 355/30 |
| 2015/0168824 A1 | 6/2015 | Sun et al. | |
| 2016/0291460 A1 | 10/2016 | Shirasaki | |
| 2017/0184956 A1 | 6/2017 | Kohmura et al. | |
| 2017/0184957 A1 * | 6/2017 | Kohmura | G03F 7/2008 |
| 2017/0192349 A1 * | 7/2017 | Kohmura | G03F 1/62 |
| 2017/0212418 A1 * | 7/2017 | Kohmura | G03F 1/64 |
| 2017/0285461 A1 | 10/2017 | Okubo et al. | |
| 2018/0046071 A1 * | 2/2018 | Kohmura | G03F 1/24 |

FOREIGN PATENT DOCUMENTS

| | | | | |
|---|---|---|---|---|
| CN | 103246157 A | | 8/2013 | |
| CN | 103676460 A | | 3/2014 | |
| JP | 60-147737 A | | 8/1985 | |
| JP | 61-145936 U | | 9/1986 | |
| JP | 63-039703 Y2 | | 10/1988 | |
| JP | 02-062542 | * | 3/1990 | G03F 1/14 |
| JP | 03-42153 A | | 4/1991 | |
| JP | 03-042153 U | * | 4/1991 | H01L 21/30 |
| JP | 04-093945 A | | 3/1992 | |
| JP | 05-107747 A | | 4/1993 | |
| JP | 05-113658 A | | 5/1993 | |
| JP | H08-160597 A | | 6/1996 | |
| JP | 10-048812 | * | 2/1998 | G03F 1/14 |
| JP | 2000-292909 A | | 10/2000 | |
| JP | 2001-312048 A | | 11/2001 | |
| JP | 2002-107914 | * | 4/2002 | G03F 1/14 |
| JP | 2002-107915 A | | 4/2002 | |
| JP | 2014-160752 A | | 11/2002 | |
| JP | 2003-107678 A | | 4/2003 | |
| JP | 2004-258113 A | | 9/2004 | |
| JP | 2004-294786 | * | 10/2004 | G03F 1/14 |
| JP | 2004-354720 A | | 12/2004 | |
| JP | 2005-019822 A | | 1/2005 | |
| JP | 2005-250188 | * | 9/2005 | G03F 1/14 |
| JP | 2006-060037 A | | 3/2006 | |
| JP | 2006-163037 A | | 6/2006 | |
| JP | 2009-151335 A | | 7/2009 | |
| JP | 2009-282298 A | | 12/2009 | |
| JP | 2011-118117 | * | 6/2011 | G03F 1/14 |
| JP | 2012-151158 | * | 8/2012 | G03F 1/62 |
| JP | 2013-534727 A | | 9/2013 | |
| JP | 2014-049677 A | | 3/2014 | |
| JP | 2002-323752 A | | 9/2014 | |
| KR | 10-2001-0051502 A | | 6/2001 | |
| KR | 10-2003-0041811 A | | 5/2003 | |
| KR | 10-2012-0111997 A | | 10/2012 | |
| KR | 10-2013-0074066 A | | 7/2013 | |
| KR | 10-2014-0048794 A | | 4/2014 | |
| TW | 201224644 A1 | | 6/2012 | |
| WO | 02/057852 A1 | | 7/2002 | |
| WO | 2009/008294 | * | 1/2009 | G03F 1/14 |

OTHER PUBLICATIONS

Shroff et al., "EUV pellicle development for mask defect control" Proc. SPIE, vol. 6151 articles 615104, 10 pages (Mar. 2006).*
International Search Report (PCT/ISA/210) dated Dec. 9, 2015, by the Japanese Patent Office as the International Searching Authority for International Application No. PCT/JP2015/076568.
Written Opinion (PCT/ISA/237) dated Dec. 9, 2015, by the Japanese Patent Office as the International Searching Authority for International Application No. PCT/JP2015/076568.
Carmen Zoldesi et al., "Progress on EUV Pellicle development" Proceedings of SPIE, Feb. 23, 2014, 10 pages, vol. 9048, 90481N.

* cited by examiner

FIG. 12A
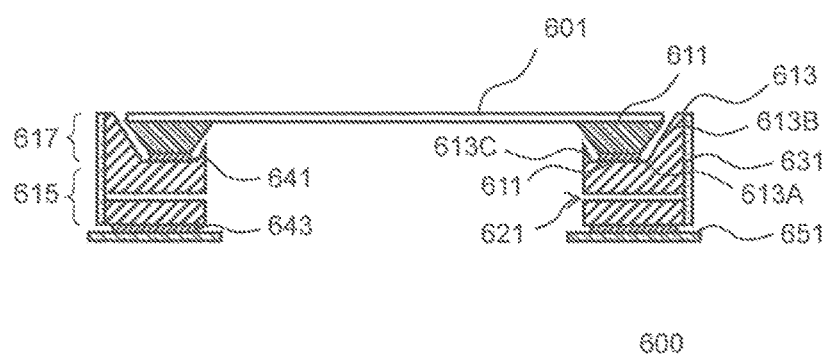
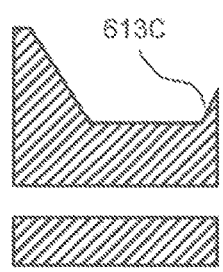
FIG. 12B
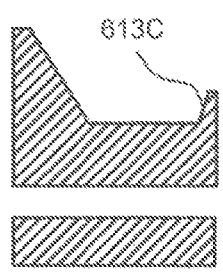
FIG. 12C
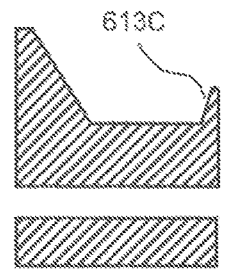
FIG. 12D

PELLICLE, PRODUCTION METHOD THEREOF, EXPOSURE METHOD

CROSS REFERENCE TO RELATED APPLICATIONS

This application is based upon and claims the benefit of priority from the prior Japanese Patent Application No. 2014-191930, filed on Sep. 19, 2014, and the prior Japanese Patent Application No. 2014-233128, filed on Nov. 17, 2014, and PCT Application No. PCT/JP2015/076568, filed on Sep. 17, 2015, the entire contents of which are incorporated herein by reference.

FIELD

The present invention relates to a pellicle usable for a photolithography process, a production method thereof, and an exposure method, and specifically, to a pellicle for extreme ultraviolet (EUV) lithography, a production method thereof, and an exposure method using the same.

BACKGROUND

In a photolithography process, in order to prevent dust or the like from being attached to a mask or a reticle, a pellicle having a pellicle film extended along one end of a frame of a size appropriate to enclose a mask pattern is used. In a state where such a pellicle is attached to the mask, the inside of the pellicle is highly airtight, and thus the pellicle film, which is thin, may sag or swell by a change in the air pressure or the temperature. When the pellicle film loses the flatness thereof in this manner, the optical characteristics of the pellicle film are changed. In the case where the pellicle film is protruded or recessed significantly, the pellicle film may contact the mask or hit the lid of a case accommodating the pellicle and thus is damaged.

As a solution to such a problem, Japanese Utility Model Publication for Opposition No. S63-39703, for example, describes a pellicle as described below. At least one vent hole is formed in a pellicle frame, and at the vent hole, a filter member inhibiting passage of dust or the like is provided in a space enclosed by a frame member, a mask substrate and a pellicle film so as not to come off. Japanese Laid-Open Patent Publication No. H5-113658 and Japanese Laid-Open Patent Publication No. 2001-312048 each describe a pellicle in which a pellicle frame has an opening in at least a part of a side surface thereof and an inner surface thereof is pressure-sensitive. Japanese Laid-Open Patent Publication No. H5-107747 describes a pellicle including a cavity in a frame so as to capture foreign objects contained in gas passing the cavity.

Meanwhile, in a pellicle including a filter, the filter needs to have fine texture in order to capture microscopic dust or the like with certainty. This causes a problem that gas passes the filter at a low speed and thus it requires a long time to alleviate the pressure difference. In order to solve this, Japanese Laid-Open Patent Publication No. 2003-107678 describes a pellicle as described below. A pellicle frame is divided into an inner member and an outer member. The inner member is formed of natural color anodized aluminum or a ceramic material, which is highly lightfast, and the outer member is formed of aluminum alloy 7075-T6, which has a high proof stress. Two vent holes each having three bending portions are provided inside the pellicle frame, and a pressure sensitive layer for adsorbing dust is provided on an inner surface of the vent hole.

Currently, the wavelength used for lithography is progressively shortened, and EUV lithography has been developed as a next-generation lithography technology. EUV light refers to light of a wavelength in a soft X-ray region or a vacuum ultraviolet region, and is a light beam of about 13.5 nm±0.3 nm. In photolithography, the limit of pattern resolution is about ½ of the exposure wavelength. Even if an immersion method is used, the limit of pattern resolution is considered to be about ¼ of the exposure wavelength. Even if an immersion method with ArF laser (wavelength: 193 nm) is used, the exposure wavelength is expected to be about 45 nm at the minimum. Therefore, EUV lithography is expected as a revolutionary technology that realizes a significant size reduction as compared with the conventional lithography.

In the meantime, EUV light is easily absorbed to any substance. Therefore, in EUV lithography, the inside of an exposure device needs to be in vacuum. EUV light has a refractive index of close to 1 with respect to any substance. Therefore, a refraction optical system using a lens and a transmissive photomask is not usable unlike in the conventional lithography using visible light or ultraviolet light. For this reason, EUV lithography requires exposure to be performed in a reflection optical system using a reflective photomask and a mirror. As described in, for example, Patent Literature 6: Japanese Laid-Open Patent Publication No. 2014-160752, a reflective photomask includes a multi-layer reflective film including a Mo layer and an Si layer stacked alternately a plurality of times on a substrate, and also includes an absorption layer, absorbing EUV light, provided on the reflective film.

SUMMARY

As described above, in EUV lithography, exposure is performed in vacuum, unlike in conventional lithography. Therefore, attachment of a pellicle to a photomask was considered as not being indispensable. However, it has been found that attachment of a pellicle to a photomask is indispensable because EUV lithography is an unconventionally microscopic process. Since EUV light is easily absorbed to any substance, the pellicle film located on a pellicle needs to be a film of a nanometer order, which is unconventional.

Since attachment of a pellicle to a photomask was first considered as not being indispensable, an EUV exposure device developed so far includes a space having a height of merely 2.5 mm for attaching a pellicle to a photomask. However, in order to provide, in an exposure device, a space having a height of 5 mm or greater for attaching a conventional pellicle, the design of the optical system needs to be significantly changed, which delays the development of EUV lithography.

Since the exposure is performed in vacuum, it is considered that the pellicle film may sag or swell. Since the space in which the pellicle is located is significantly restricted, a sufficient amount of air needs to be provided through a vent hole provided in a frame of the pellicle in order to prevent the pellicle film of a nanometer order from being damaged. The vent hole needs to be provided with a filter. Since the space in which the pellicle is located is significantly restricted, there is also a significant restriction on the height of the frame. Therefore, for attaching the filter to the frame, an unconventional design is necessary.

The present invention for solving the above-described problems has an object of providing a pellicle for extreme ultraviolet light lithography, a production method thereof, and an exposure method.

In a pellicle for extreme ultraviolet light lithography, a very thin pellicle film is bonded to a frame. Therefore, if the pellicle film is bonded to the photomask from above the frame with a force as conventionally done, the pellicle film may be broken. For this reason, the pellicle for extreme ultraviolet light lithography needs to be bonded to the photomask in a non-contact manner by use of a dedicated bonding device. Herein, the term "non-contact manner" indicates that no strong force is applied from above the frame, and the "strong force" is at least about 1 kgf, which is used for conventional bonding of a photomask. The present invention has, in addition to the above-described object, an object of providing a pellicle for extreme ultraviolet light lithography that is bondable to a photomask in a non-contact manner, and a production method thereof.

Provided in an embodiment according to the present invention is a pellicle including a first frame having a pellicle film located thereon; a second frame including a thick portion including a first surface carrying a surface of the first frame opposite to a surface on which the pellicle film is located, and also including a second surface connected with the first surface and carrying a side surface of the first frame, the second frame enclosing the pellicle film and the first frame; a through-hole provided in the thick portion of the second frame; and a filter located on an outer side surface of the second frame and covering the through-hole, the outer side surface crossing the surface of the first frame on which the pellicle film is located.

In the above-described pellicle, the second surface, engaged with the first frame, of the second frame may be perpendicular to the surface of the first frame on which the pellicle film is located.

In the above-described pellicle, the second surface, engaged with the first frame, of the second frame may be inclined inward with respect to the surface of the first frame on which the pellicle film is located.

In the above-described pellicle, the second frame may further include a third surface connected with the first surface and facing the second surface; and the third surface of the second frame may be located to face an inner side surface of the first frame.

In the above-described pellicle, third surface, engaged with the first frame, of the second frame may be perpendicular to the surface of the first frame on which the pellicle film is located.

In the above-described pellicle, the third surface, engaged with the first frame, of the second frame may be inclined such that a distance between the third surface and the second surface increases toward the surface of the first frame on which the pellicle film is located.

In the above-described pellicle, first frame and the thick portion of the second frame may be bonded to each other with an adhesive layer.

In the above-described pellicle, the pellicle film may have a transmittance of 90.0% or greater with respect to light having a wavelength of 5 nm or longer and 30 nm or shorter, and may have a thickness of 20 nm or greater and 50 nm or less.

In the above-described pellicle, a total of a height of the second frame and a height of an adhesive layer located on a bottom surface of the second frame may be 2 mm or less.

In the above-described pellicle, the first frame may be formed of a material selected from the group consisting of silicon, sapphire and silicon carbide.

In the above-described pellicle, a total area size of a gas passage portion of the filter may have a ratio of, with respect to an inner volume of the pellicle, 0.007 mm$^{-1}$ or greater and 0.026 mm$^{-1}$ or less.

Provided in an embodiment according to the present invention is a method for producing a pellicle including forming a pellicle film on a substrate; shaping the substrate into a frame to expose the pellicle film, thereby forming a first frame; preparing a second frame including a thick portion including a first surface carrying a surface of the first frame opposite to a surface on which the pellicle film is located, and also including a second surface connected with the first surface and carrying a side surface of the first frame; forming a through-hole in the thick portion in the second frame; bonding a filter covering the through-hole on an outer surface of the second frame, the outer surface being parallel to a height direction of the second frame; and securing the first frame to the second frame with an adhesive layer such that the second frame encloses the first frame.

In the above-described method for producing a pellicle, the pellicle film may be exposed by dry etching, the second frame including the second surface perpendicular to the surface of the first frame on which the pellicle film is formed may be prepared, and the first frame may be secured to the second frame with the adhesive layer.

In the above-described method for producing a pellicle, the pellicle film may be exposed by wet etching, the second frame including the second surface inclined inward with respect to the surface of the first frame on which the pellicle film is formed may be prepared, and the first frame may be secured to the second frame with the adhesive layer.

In the above-described method for producing a pellicle, the pellicle film may be exposed by dry etching, the second frame including the second surface and a third surface connected with the first surface and facing the second surface may be prepared, the second surface and the third surface being perpendicular to the surface of the first frame on which the pellicle film is formed, and the first frame may be secured to the second frame with the adhesive layer.

In the above-described method for producing a pellicle, the pellicle film may be exposed by wet etching, the second frame including the second surface and a third surface may be prepared, the second surface being inclined inward with respect to the surface of the first frame on which the pellicle film is formed, the third surface being inclined such that a distance between the third surface and the second surface increases toward the surface of the first frame on which the pellicle film is located, and the first frame may be secured to the second frame with the adhesive layer.

In the above-described method for producing a pellicle, the pellicle film having a thickness of 20 nm or greater and 50 nm or less may be formed on the substrate; and the pellicle film may have a transmittance of 90.0% or greater with respect to light having a wavelength of 5 nm or longer and 30 nm or shorter.

In the above-described method for producing a pellicle, a total of a height of the second frame and a height of an adhesive layer located on a bottom surface of the second frame may be 2 mm or less.

In the above-described method for producing a pellicle, the first frame may be selected from the group consisting of a silicon substrate, a sapphire substrate and a silicon carbide substrate.

In the above-described method for producing a pellicle, a total area size of a gas passage portion of the filter may have a ratio of, with respect to an inner volume of the pellicle, 0.007 mm$^{-1}$ or greater and 0.026 mm$^{-1}$ or less.

Provided is an exposure method including locating a pellicle according to claim 1 on a reticle surface of a photomask; locating the photomask at a predetermined position in an exposure device and causing the pellicle to be accommodated in a gap having a distance of 3 mm or less from the reticle surface; directing, in vacuum, light having a wavelength of 5 nm or longer and 30 nm or shorter toward the photomask having the pellicle located thereon; and exposing light output from the reticle surface of the photomask having the pellicle located thereon toward a substrate having a resist layer formed thereon.

BRIEF DESCRIPTION OF DRAWINGS

FIG. 12A provides schematic views of a pellicle 600 in an embodiment and is a cross-sectional view of the pellicle 600 taken along line A-A' in FIG. 1;

FIG. 12B shows modifications of a second frame 613;

FIG. 12C shows modifications of a second frame 613;

FIG. 12D shows modifications of a second frame 613;

REFERENCE SIGNS LIST

Figure 1:
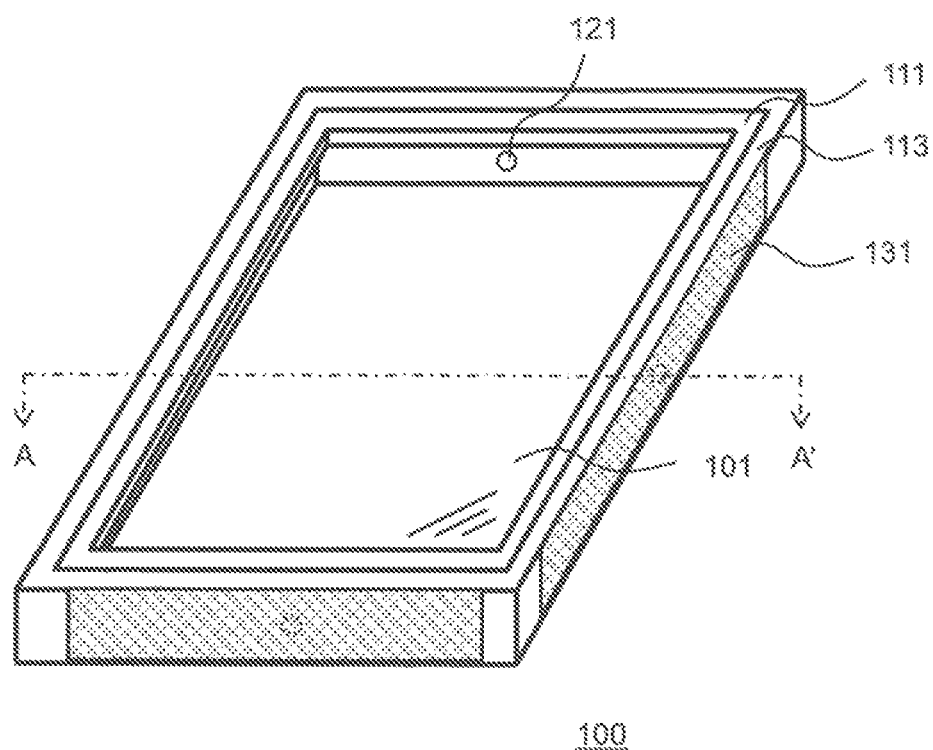
FIG. 1 is a schematic view (perspective view) of a pellicle 100 in an embodiment.

100: pellicle; 101; pellicle film; 105: substrate; 111: first frame; 113: second frame; 113A: first surface; 113B: second surface; 115: thick portion; 117: thin portion; 121: through-hole; 131: filter; 135: gas passage portion; 137: bonding portion; 141: adhesive layer; 143: adhesive layer; 151: liner; 200: pellicle; 201: pellicle film; 205: substrate; 211: first frame; 213: second frame; 213A: first surface; 213B: second surface; 215: thick portion; 217: thin portion; 221: through-hole; 231: filter; 241: adhesive layer; 243: adhesive layer; 251: liner; 300: pellicle; 301: pellicle film; 305: substrate; 311: first frame; 313: second frame; 313A: first surface; 313B: second surface; 315: thick portion; 317: thin portion; 321: through-hole; 331: filter; 341: adhesive layer; 343: adhesive layer; 351: liner; 400: pellicle; 401: pellicle film; 411: first frame; 413: second frame; 413A: first surface; 413B: second surface; 415: thick portion; 417: thin portion; 421: through-hole; 431: filter; 441: adhesive layer; 443: adhesive layer; 451: liner; 500: pellicle; 501: pellicle film; 511: first frame; 513: second frame; 513A: first surface; 513B: second surface; 513C: third surface; 515: thick portion; 517: thin portion; 521: through-hole; 531: filter; 541: adhesive layer; 543: adhesive layer; 551: liner; 600: pellicle; 601: pellicle film; 611: first frame; 613: second frame; 613A: first surface; 613B: second surface; 613C: third surface; 615: thick portion; 617: thin portion; 621: through-hole; 631: filter; 641: adhesive layer; 643: adhesive layer; 651: liner; 700: pellicle; 701: pellicle film; 711: first frame; 713: second frame; 713A: first surface; 713B: second surface; 714: groove; 714A: through-hole; 714B: through-hole; 715: thick portion; 716: groove; 716A: through-hole; 716B: through-hole; 717: thin portion; 721: through-hole; 731: filter; 741: adhesive layer; 743: adhesive layer; 751: liner; 800: pellicle; 801: pellicle film; 811: first frame; 813: second frame; 821: through-hole; 831: filter; 841: adhesive layer; 843: adhesive layer; 851: liner; 890: gap; 900: pellicle; 901: pellicle film; 911: first frame; 913: second frame; 921: through-hole; 931: filter; 941: adhesive layer; 943: adhesive layer; 951: liner; 990: gap; 1000: pellicle production device; 1100: vacuum chamber; 1200: table; 1110: supply tube; 1120A: discharge tube; 1120B: discharge tube; 2000: photomask production device; 2100: vacuum chamber; 2110: supply tube; 2120A: discharge tube; 2120B: discharge tube; 2500: photomask; 3000: photomask production device; 3100: vacuum chamber; 3110: supply tube; 3120A: discharge tube; 3120B: discharge tube; 3220A: discharge tube; 3220B: discharge tube; 3500: photomask

DESCRIPTION OF EMBODIMENTS

In this specification, EUV light refers to light having a wavelength of 5 nm or longer and 30 nm or shorter. The wavelength of the EUV light is preferably about 5 nm to about 13.5 nm, and is more preferably 13.5±0.3 nm. EUV light is easily absorbed to any substance. Therefore, according to the present invention, a pellicle film needs to be a film of a nanometer order. The pellicle film according to the present invention has a transmittance of 90.0% or greater with respect to light having a wavelength of 5 nm or longer and 30 nm or shorter. The pellicle film according to the present invention has a transmittance of 90.0% or greater with respect to light having a wavelength of, preferably, about 5 nm to about 13.5 nm, more preferably 13.5±0.3 nm. In order to obtain such a transmittance, the pellicle film according to the present invention has a thickness of 10 nm or greater and 100 nm or less, preferably 10 nm or greater and 50 nm or less.

EUV transmittance T of a pellicle film is defined by the following expression (1).

$$T \equiv \frac{I}{I_0} \quad (1)$$

In expression (1), I is the transmitting light intensity, and $I_0$ is the incident light intensity. The transmitting light intensity I, the incident light intensity $I_0$, the thickness d of the pellicle film, the density $\rho$ of the pellicle film, and the mass absorption coefficient $\mu$ of the pellicle film have the relationship represented by the following expression (2).

$$I = I_0 \exp(-\mu \rho d) \quad (2)$$

In expression (2), the density $\rho$ is the density inherent to the material forming the pellicle film. The mass absorption coefficient $\mu$ in expression (2) is found as follows. In the case where the optical energy is greater than about 30 eV and the photon energy is sufficiently far from the atomic absorption edge, the mass absorption coefficient $\mu$ does not depend on the inter-atom bonding state or the like. The photon energy of a wavelength of 13.5 nm is around 92.5 eV, and is also sufficiently far from the atomic absorption edge. Therefore, the mass absorption coefficient $\mu$ does not depend on the inter-atom bonding state of a compound forming the pellicle film. Thus, the mass absorption coefficient $\mu$ of the pellicle film is found by the following expression (3) from the mass absorption coefficient $\mu_1$ of each of elements forming the pellicle film (1, 2, ..., i) and the mass fraction $W_i$ of each element.

$$\mu = \mu_1 W_1 + \mu_2 W_2 + \ldots \mu_i W_i \quad (3)$$

$W_i$ is a value found by $W_i = n_i A_i / \Sigma n_i A_i$. $A_i$ is the atomic weight of each element i, and $n_i$ is the number of atoms of each element i.

For the mass absorption coefficient $\mu_i$ of each element in expression (3), the values in the following reference document provided by Henke, et al. may be referred to. (B. L. Henke, E. M. Gullikson, and J. C. Davis, "X-Ray Interactions: Photoabsorption, Scattering, Transmission, and Reflection at E=50-30,000 eV, Z=1-92," At. Data Nucl. Data Tables 54, 181 (1993). The latest numerical values are described in http://www.cxro.lbl.gov/optical_constants/.)

Once the mass absorption coefficient $\mu$, the density $\rho$ and the thickness d of the pellicle film are specified, the transmittance of the pellicle film with respect to light having a wavelength of 13.5 nm is calculated based on expressions (1) and (2). The above transmittance is also calculated at the website regarding optical constants of the Center for X-Ray Optics in the Lawrence Berkeley National Laboratory.

In order to increase the thickness and also increase the transmittance, it is desirable to use a material having a low absorption coefficient as the material of the pellicle film. Specifically, it is desirable to use a material formed of an element having a mass absorption coefficient of 100 or less where the mass absorption coefficient $\mu$ of hydrogen is 1. Especially, it is desirable to use an element such as H, Be, B, C, N, O, Si, P, S, Cl, K, Ca, Sc, Br, Rb, Sr, Y, Zr, Nb, Mo, Tc, Ru, or the like.

Examples of the practical compound forming the pellicle film include polymer compounds such as fluorine-based polymer, polyolefin, polyimide and the like, metal materials such as ruthenium, nickel, zirconium, titanium, molybdenum, niobium, and the like; crystalline silicon (e.g., single crystalline silicon, polycrystalline silicon, etc.); amorphous silicon, diamond-like carbon (DLC), graphite; amorphous carbon; graphene; silicon carbide; silicon nitride; and the like.

The pellicle film may include an antioxidant film or a heat radiation film. The antioxidant film may be formed of, for example, $SiO_x$ (x≤2), $Si_xN_y$ (x/y=0.7 to 1.5), SiON, SiC, $Y_2O_3$, YN, Mo, Ru or Rh.

The heat radiation film is preferably formed of a material having a high thermal radiation ratio or thermal conductivity. Specifically, the heat radiation film may be formed of, for example, any of substantially the same materials as those of the antioxidant film, Rb, Sr, Y, Zr, Nb, graphite, graphene or the like. The antioxidant film and the heat radiation film may be formed on one surface, or both of two surfaces, of the pellicle film. The pellicle film may contain a single element or compound, or two or more elements or compounds.

A conventional pellicle for ArF lithography includes a frame formed of aluminum, a ceramic material or the like, and the pellicle film is bonded to the frame with an adhesive layer. However, the pellicle film according to the present invention for EUV lithography is a very thin film having a thickness of 20 nm or greater and 50 nm or less. Therefore, it is difficult to secure the pellicle film to the frame by bonding. Thus, a semiconductor production process may be used. A pellicle film is formed on a substrate by, for example, vapor deposition. The substrate is back-etched into a frame shape to expose the pellicle film. In this manner, a frame having a pellicle film located thereon is obtained. The substrate according to the present invention may be, for example, a silicon substrate, a sapphire substrate, a silicon carbide substrate or the like. The substrate is not limited to any of these, but is preferably a silicon substrate, a sapphire substrate, or a silicon carbide substrate, and is more preferably a silicon substrate.

As described above, the space for attaching a pellicle to a photomask has a height of merely 2.5 mm. In order to prevent breakage of the pellicle film, the height of the pellicle is preferably 2 mm or less. In the case where a very thin pellicle film is formed by the above-described method, it is difficult to form a through-hole as a vent hole in a side surface of the frame. According to a conceivable method, a first frame having a pellicle film located thereon and a second frame having a through-hole formed in a side surface thereof are separately formed, and are bonded to each other with an adhesive layer. The first frame preferably has a thickness of 1 mm or less from the point of view of formation of the pellicle film and ease of handling, but it is difficult to form the first frame to have a thickness of 100 μm or less. The pellicle includes the adhesive layer for bonding the first frame and the second frame and also an adhesive layer for bonding the pellicle and the mask, and therefore, the second frame having a through-hole is permitted to have a thickness of 1 to 1.5 mm at the maximum. In the case where the through-hole is covered with a filter to protect the through-hole against dust, it is difficult to locate the filter of 1.5 mm or less on a side surface of the second frame from the point of view of adhesiveness or ease of handling.

Figure 17A:
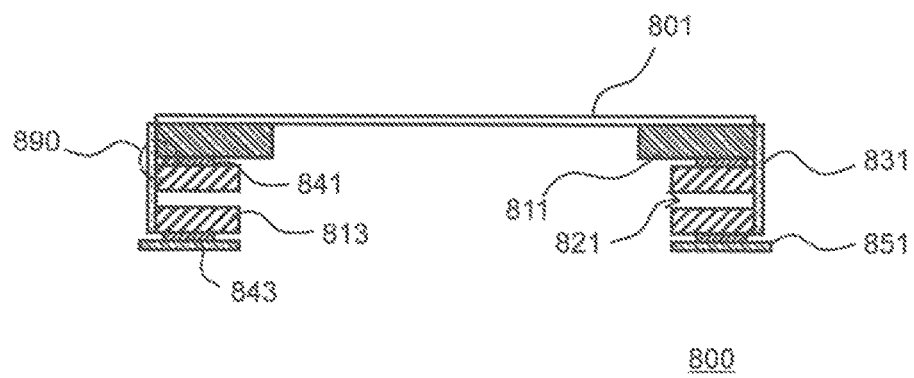
FIG. 17A shows examples examined in an embodiment and is a cross-sectional view of a pellicle 800.
Figure 17B:
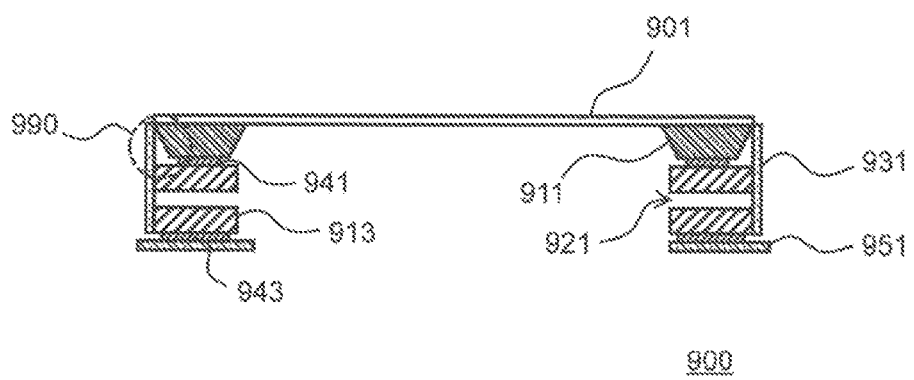
FIG. 17B is a cross-sectional view of a pellicle 900.

Under such circumstances, it is conceivable to locate a filter of about 2 mm on a side surface of the first frame and the second frame bonded together with an adhesive layer. In this case, however, a problem shown in FIGS. 17A and 17B are caused. FIGS. 17A and 17B provide schematic views of a pellicle including a filter of about 2 mm on a side surface of a first frame and a second frame bonded together with an adhesive layer. FIG. 17A is a schematic view of a pellicle 800 including a first frame formed by dry etching. FIG. 17B is a schematic view of a pellicle 900 including a first frame formed by wet etching.

The pellicle 800 includes a first frame 811 having a pellicle film 801 located thereon, and a second frame 813 secured to the first frame 811 with an adhesive layer 841. The second frame 813 has a through-hole 821 running through an outer side surface and an inner side surface thereof. On a side surface of the first frame 811 and the second frame 813 bonded together with the adhesive layer 841, a filter 831 covering the through-hole 821 is bonded with an adhesive layer (not shown). An adhesive layer 843 used to secure the pellicle 800 to a photomask is formed on a bottom surface of the second frame 813. Until the pellicle 800 is secured to the photomask, the adhesive layer 843 is protected by a liner 851. In this state, a gap 890 is formed at the adhesive layer 841 bonding the first frame 811 and the second frame 813 to each other.

Such a gap formed on a rear surface (bonding surface) of the filter is conspicuous in the case where the first frame is formed by wet etching. The pellicle 900 includes a first frame 911 having a pellicle film 901 located thereon, and a second frame 913 secured to the first frame 911 with an adhesive layer 941. The second frame 913 has a through-hole 921 running through an outer side surface and an inner side surface thereof. On a side surface of the first frame 911 and the second frame 913 bonded together with the adhesive layer 941, a filter 931 covering the through-hole 921 is bonded with an adhesive layer (not shown). An adhesive layer 943 used to secure the pellicle 900 to a photomask is formed on a bottom surface of the second frame 913. Until the pellicle 900 is secured to the photomask, the adhesive layer 943 is protected by a liner 951. In the pellicle 900, the first frame 911 is formed by wet etching. Therefore, as shown in FIG. 17B, the side surface of the first frame 911 is inclined, and the first frame 911 has a trapezoidal cross-section. In this state, a gap 990 is formed between the first frame 911 and the adhesive layer 941, and thus the filter 931 is not sufficiently close-adhesive.

Thus, the present inventors made studies regarding a structure of a pellicle having a sufficient close-adhesiveness with no gap being formed on a rear surface of the filter. Hereinafter, a pellicle, a production method thereof, and an exposure method according to the present invention will be described with reference to the figures. It should be noted that the pellicle, the production method thereof, and the exposure method according to the present invention may be carried out in various embodiments, and should not be construed as being limited to any of the following embodiments or examples. In the figures referred to regarding the embodiments and the example, the same elements or elements having substantially the same functions will bear the same reference signs, and repeated descriptions will be omitted.

(Embodiment 1)

Figure 2:
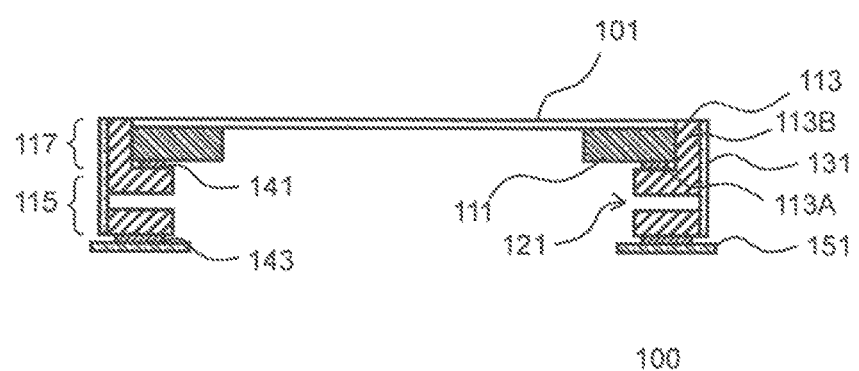
FIG. 2 is a cross-sectional view of pellicle 100 in an embodiment, taken along line A-A' in FIG. 1.

FIG. 1 is a schematic view (perspective view) of a pellicle 100 in an embodiment according to the present invention. FIG. 2 is a cross-sectional view of the pellicle 100 taken along line A-A' in FIG. 1. The pellicle 100 includes a first frame 111 having a pellicle film 101 located thereon, and a second frame 113 securing the first frame 111. The second frame 113 includes a thick portion 115 including a first surface 113A carrying a surface of the first frame 111 opposite to a surface on which the pellicle film 101 is located, and also includes a second surface 113B connected with the first surface 113A and carrying a side surface of the first frame 111. The second frame 113 encloses the pellicle film 101 and the first frame 111. The second frame 113 has an L-shaped cross-section perpendicular to the pellicle film 101. The pellicle 100 also has a through-hole 121 provided in the second frame 113 and a filter 131 covering the through-hole 121. The through-hole 121 is provided in the thick portion 115 of the second frame 113. The thick portion 115 of the second frame 113 is thick in a direction crossing the surface of the first frame 111 on which the pellicle film 101 is located. The filter 131 is located on an outer side surface, of the second frame 113, that crosses the surface of the first frame 111 on which the pellicle film 101 is located, via an adhesive layer (not shown).

As the pellicle film 101 and the first frame 111, the pellicle film and the substrate described above are usable. Thus, the pellicle film 101 and the first frame 111 will not be described in detail. The first frame 111 is formed of, preferably, silicon, sapphire or silicon carbide, more preferably silicon. The second frame 113 is preferably formed of a material that is tolerant to EUV light, is highly flat and is low ion-eluting. In order to remove stain derived from carbon, hydrogen gas is supplied to flow in an exposure device. Therefore, the second frame 113 is preferably formed of a material that is tolerant to hydrogen radicals.

There is no specific limitation on the material of the second frame 113 (pellicle frame), and may be formed of a material normally usable for a pellicle frame. Specific materials usable for the second frame 113 include aluminum, an aluminum alloy (5000 series, 6000 series, 7000 series, etc.), stainless steel, silicon, a silicon alloy, iron, an iron-based alloy, carbon steel, tool steel, a ceramic material, a metal-ceramic composite material, a resin, and the like. Among these materials, aluminum and an aluminum alloy, which are lightweight and rigid, are preferable. The second frame 113 may include a protective film at a surface thereof.

The protective film is preferably formed of a material that is tolerant to hydrogen radicals and EUV light present in the exposure atmosphere. An example of protective film is an oxide film. An oxide film may be formed by a known method such as anodization or the like.

The first frame 111 and the second frame 113 are secured to each other with an adhesive layer 141. In FIG. 2, the adhesive layer 141 is located on the first surface 113A of the thick portion 115 of the second frame 113. The thick portion 115 is thick in the direction crossing the surface of the first frame 111 on which the pellicle film 101 is located. In order to reinforce the adhesive layer 141, another adhesive layer may be provided between, for example, the side surface of the first frame 111 and the second surface 1136, which is in contact with the side surface of the first frame 111, of a thin portion 117 of the second frame 113.

Preferably, the adhesive layer 141 has a minimum possible thickness that guarantees a sufficient adhesiveness between the first frame 111 and the second frame 113. For example, the adhesive layer 141 has a thickness of 10 μm or greater and 300 μm or less. The adhesive layer 141 is preferably formed of an adhesive material that is tolerant to EUV light and does not generate much gas. In order to remove stain derived from carbon, hydrogen gas is supplied to flow in the exposure device. Therefore, the adhesive layer 141 is preferably formed of a material that is tolerant to hydrogen radicals.

In this specification, the term "adhesive" refers to an adhesive in a broad sense. The concept of the "adhesive" encompasses a pressure sensitive adhesive. Examples of the adhesive include an acrylic resin-based adhesive, an epoxy resin-based adhesive, a polyimide resin-based adhesive, a silicone resin-based adhesive, an inorganic adhesive, two-sided pressure sensitive adhesive tape, a silicone resin-based pressure sensitive adhesive, an acrylic resin-based pressure sensitive adhesive, a polyolefin-based pressure sensitive adhesive, and the like.

Preferable examples of the adhesive usable for bonding the first frame 111 and the second frame 113 include an acrylic resin-based adhesive, an epoxy resin-based adhesive, a polyimide resin-based adhesive, a silicone resin-based adhesive, and an inorganic adhesive. Preferable examples of the adhesive usable for bonding a photomask include two-sided pressure sensitive adhesive tape, a silicone resin-based pressure sensitive adhesive, an acrylic resin-based pressure sensitive adhesive, and a polyolefin-based pressure sensitive adhesive.

The through-hole 121 is provided in the thick portion 115 of the second frame 113. The thick portion 115 of the second frame 113 is thick in the direction crossing the surface of the first frame 111 on which the pellicle film 101 is located. Preferably, the pellicle 100 has a maximum possible height in order to prevent image formation of a foreign object, with the upper limit of 2.5 mm for the reason caused by the exposure device. According to known information, the pellicle needs to be at least 2 mm high (e.g., Carmen Zoldesi, et al., "Progress on EUV Pellicle development", Proceedings of SPIE, 2014.02.03, vol. 9048, 90481N). In consideration of the above, the through-hole 121 has such a diameter that, when the pressure is decreased from normal pressure (0.1 MPa) to a vacuum state at the time of exposure ($10^{-4}$ to $10^{-6}$ Pa), suppresses the expansion of the pellicle film 101, by a pressure difference between the inside and the outside of the pellicle 100, to less than 0.5 mm. In this embodiment, the diameter of the through-hole 121 is set in consideration of the upper limit of the pressure loss caused at the through-hole 121 when the pressure is decreased.

The pressure loss caused at the through-hole 121 when the pressure is decreased is desirably 1 Pa or less, more desirably 0.5 Pa or less. It is preferable that the filter 131 is located to cover the through-hole 121, so that when the pressure is decreased, a majority of the pressure loss is caused at the filter 131 whereas almost no pressure loss is caused at the through-hole 121. For example, the size and the number of the through-holes 121 are adjusted such that the pressure loss at the through-holes 121 is 1 Pa or less, preferably about 0.1 Pa.

In the case where, for example, the pressure is decreased at a rate of 350 Pa/sec., when the pressure loss caused at the through-hole 121, i.e., the pressure difference between the inside and the outside of the pellicle 100, is 1 Pa, the number of the through-holes 121 is 4 and the diameter of each through-hole 121 is 480 μm, or the number of the through-holes 121 is 40 and the diameter of each through-hole 121 is 300 μm. The through-holes 121 may have any shape with no specific limitation, and may be circular, elliptical, rectangular, polygonal, trapezoidal or the like. There is no specific limitation on the diameter of the through-holes 121, but it is preferable that the through-holes 121 each have a diameter of about 10 to 500 μm as long as the strength of the frame is not decreased. There is no specific limitation on the number of the through-holes 121, and the number of the through-holes 121 may be selected in accordance with the length or the width of the filter 131. In the case where a plurality of through-holes 121 are provided, it is preferable that the through-holes 121 are located at an equal interval in the filter 131 although there is no specific limitation on the positions or the interval between the through-holes 121.

Desirably, the filter 131 is formed of a material that prevents dust or the like from flowing into the pellicle 100 secured to the photomask, and has an initial pressure loss of 100 Pa or greater and 550 Pa or less and a particle capture rate of 99.7% or greater and 100% or less for particles having a particle diameter of 0.15 μm or greater and 0.3 μm or less. The filter 131 may be, for example, a ULPA filter (Ultra Low Penetration Air Filter). A ULPA filter is an air filter having a particle capture rate of 99.9995% or greater at rated flow for particles having a particle diameter of 0.15 μm and an initial pressure loss of 245 Pa or less. The filter 131 may be a HEPA filter (High Efficiency Particulate Air Filter). A HEPA filter is an air filter having a particle capture rate of 99.97% or greater at rated flow for particles having a particle diameter of 0.3 μm and an initial pressure loss of 245 Pa or less. Preferably, the filter 131 has a width (height) that is approximately equal to that of the second frame 113 in order to guarantee the adhesiveness with the second frame 113.

Figure 3A:
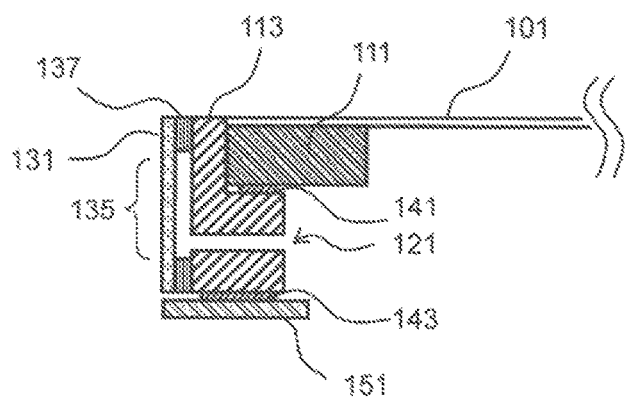
FIG. 3A provides enlarged views of a frame of the pellicle 100 in an embodiment shown in FIG. 2; and is an enlarged view of the frame.
Figure 3B:
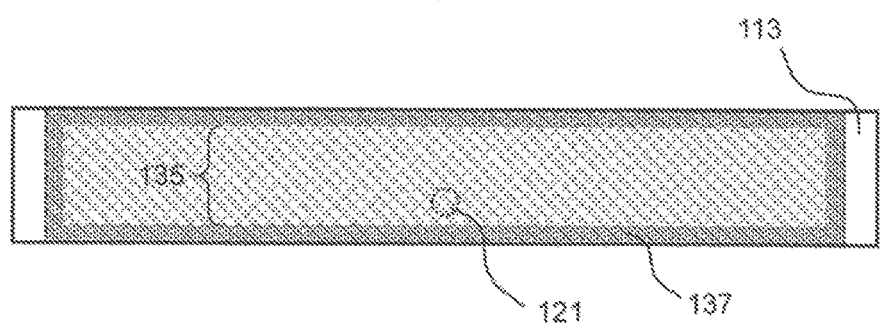
FIG. 3B is a schematic view showing a structure of a gas passage portion 135 and a bonding portion 137 of a filter 131.

The filter 131 includes a gas passage portion 135 and a bonding portion 137 (FIGS. 3A and 3B). The bonding portion 137 is provided along the periphery of the filter 131 so as to encompass the gas passage portion 135. The bonding portion 137 has a role of bonding the second frame 113 and the gas passage portion 135 to each other with no gap. The bonding portion 137 does not pass gas. The bonding portion 137 has a width of 0.2 mm or greater and 1.0 mm or less. In order to increase the area size of the gas passage portion 135, the bonding portion 137 is desirably as thin as possible.

The gas passage portion 135 refers to a portion of the filter 131 that is not covered with the bonding portion 137. Gas passes the gas passage portion 135 and particles contained in the gas are captured. Since the pressure loss is caused at the gas passage portion 135, the ventilation performance of the filter is determined by the ventilation performance of the gas passage portion 135.

The total area size of the gas passage portion 135 of the filter 131 is set in consideration of the upper limit of the pressure loss caused at the filter 131 when the pressure is decreased. The pressure loss caused at the gas passage portion 135 of the filter 131 when the pressure is decreased is desirably 2 Pa or less. The length of the gas passage portion 135 of the filter 131 is calculated by dividing the area size of the gas passage portion 135 of the filter 131 by the width of the gas passage portion 135 of the filter 131. There is no specific limitation on the length of the gas passage portion 135 per filter 131. The length of the gas passage portion 135 per filter 131 is desirably 1 cm or greater and 15 cm or less, more desirably 2 cm or greater and 10 cm or less.

It is currently assumed that the pellicle for EUV exposure has a length of a longer side of 152 mm or less, a length of a shorter side of 120 mm or less, and a height of 2 mm or less, and is depressurized or pressurized at 350 Pa/sec. In order to realize a state where the expansion of the pellicle film 101 caused by the pressure difference between the inside and the outside of the pellicle 100 is less than 0.5 mm when the pressure is decreased from normal pressure (0.1 MPa) to a vacuum state at the time of exposure ($10^4$ to $10^{-6}$ Pa/sec), or when the pressure is returned from the vacuum state to normal pressure, it is preferable that the ratio of the total area size of the gas passage portion 135 of the filter 131 with respect to the inner volume of the pellicle 100 (area size of the gas passage portion of the filter/inner volume of the pellicle) is 0.007 $mm^{-1}$ or greater and 0.026 $mm^{-1}$ or less. In the case where this ratio is 0.007 $mm^{-1}$ or greater, the flow rate of the gas passing the gas passage portion of the filter is not too high at the time of depressurization and pressurization. Therefore, the pressure difference between the inside and the outside of the pellicle 100 is suppressed from increasing, and thus the expansion of the pellicle film 101 is suppressed to less than 0.5 mm. In the case where this ratio is 0.026 $mm^{-1}$ or less, the gas passage portion 135 and the bonding portion 137 of the filter 131 each have a sufficiently large size despite the restriction on the size of the gas passage portion 135 that can be formed.

In this embodiment, the second surface 113B, which is an inner surface of the second frame 113, is engaged with the first frame 111 and crosses the surface of the first frame 111 on which the pellicle film 101 is located, is perpendicular to the surface of the first frame 111 on which the pellicle film 101 is located. The side surface of the first frame 111 is perpendicular to the surface on which the pellicle film 101 is located. The second surface 113B, which is an inner surface of the thin portion 117 of the second frame 113 and is engaged with the first frame 111, is perpendicular to the first surface 113A of the second frame 113. For such a structure, the first frame 111 and the second frame 113 are highly close-adhesive to each other. In this state, the first frame 111 and the second frame 113 are preferably located such that a top surface of the pellicle film 101 and a top surface of the second frame 113 are on the same plane.

An adhesive layer 143 is located on a bottom surface of the thick portion 115 of the second frame 113. The adhesive layer 143 is an element used to secure the pellicle 100 to the photomask. The adhesive layer 143 preferably has a minimum possible thickness that guarantees a sufficient adhesiveness between the photomask and the second frame 113. The thickness of the adhesive layer 143 is, for example, 10 μm or greater and 300 μm or less. The adhesive layer 143 may be formed of an adhesive material that is tolerant to EUV light and does not generate much gas. In order to remove stain derived from carbon, hydrogen gas is supplied to flow in the exposure device. Therefore, the adhesive layer 143 is preferably formed of a material that is tolerant to hydrogen radicals.

Examples of the adhesive material include an acrylic resin-based adhesive, an epoxy resin-based adhesive, a polyimide resin-based adhesive, a silicone resin-based adhesive, an inorganic adhesive, two-sided pressure sensitive adhesive tape, a silicone resin-based pressure sensitive adhesive, an acrylic resin-based pressure sensitive adhesive, a polyolefin-based pressure sensitive adhesive, and the like. The material of the adhesive layer 143 may be the same as, or different from, the material of the adhesive 141.

Regarding the pellicle 100, it is preferable that the total of the height of the second frame 113 and the height of the adhesive layer 143 located on the bottom surface of the second frame 113 is 2 mm or less. As described above, a space for attaching the pellicle to the photomask has a height of merely 2.5 mm. Therefore, in order to prevent breakage of the pellicle film 101, the height of the pellicle 100 is preferably 2 mm or less.

In order to prevent dust or the like from being attached to the adhesive layer 143 of the pellicle 100 before use, the adhesive layer 143 is protected by a peelable liner 151.

According to the present invention, the second frame 113 is formed of a member having an L-shaped cross-section, and the height of the filter 131 and the height of the second frame 113 are made approximately equal to each other. Thus, the filter 131 is located with a sufficient close-adhesiveness with no gap, other than the through-hole 121, being formed in a rear surface of the filter 131.

(Method for Producing the Pellicle 100)

Figure 4A:
FIG. 4A provides schematic views showing production steps of the pellicle 100 in an embodiment.

The pellicle 100 in this embodiment may be produced by, for example, a method described below with reference to FIGS. 4A to 4D and FIGS. 5A to 5D. The following production process is an example, and the order of production steps may be changed when necessary. FIGS. 4A to 4D and FIGS. 5A to 5D show the production steps of the pellicle 100. A substrate 105 is prepared, and the pellicle film 101 is formed on the substrate 105 (FIG. 4A). As described above, the substrate 105 may be a silicon substrate, a sapphire substrate, a silicon carbide substrate or the like, but is not limited to any of these.

The pellicle film 101 is formed by vapor deposition on the substrate 105 so as to have a thickness of 20 nm or greater and 50 nm or less. EUV light is easily absorbed to any substance. Therefore, it is preferable that the pellicle film 101 is formed to be thin so as to have a transmittance of 90.0% or greater with respect to light having a wavelength of 5 nm or longer and 30 nm or shorter. The pellicle film 101 according to the present invention has a transmittance of 90.0% or greater with respect to light having a wavelength of, preferably, about 5 nm to about 13.5 nm, more preferably 13.5±0.3 nm.

Figure 4B:
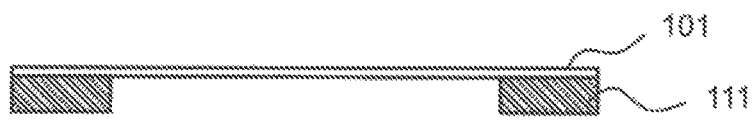
FIG. 4B provides schematic views showing production steps of the pellicle 100 in an embodiment.

The substrate 105 having the pellicle film 101 formed thereon is dry-etched such that the substrate 105 is frame-shaped to expose the pellicle film 101. Thus, the first frame 111 is formed (FIG. 4B). The side surface of the first frame 111 formed by dry etching is approximately perpendicular to the surface on which the pellicle film 101 is formed.

Figure 4C:
FIG. 4C provides schematic views showing production steps of the pellicle 100 in an embodiment.

Separately from the above, the second frame 113 having an L-shaped cross-section in the height direction is prepared (FIG. 4C). In this embodiment, the second surface 113B, which is the inner side surface of the thin portion 117 of the second frame 113, is approximately perpendicular to the first surface 113A. Namely, the second surface 113B, which is the inner surface of the second frame 113 and crosses the surface of the first frame 111 on which the pellicle film 101 is located, is perpendicular to the surface of the first frame 111 on which the pellicle film 101 is formed.

Figure 4D:
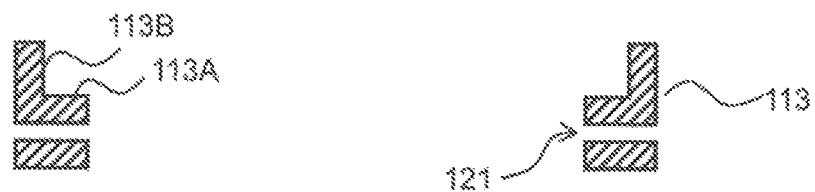
FIG. 4D provides schematic views showing production steps of the pellicle 100 in an embodiment.

The through-hole 121 is formed in the thick portion 115, which is thick in the direction crossing the height direction of the second frame 113 (FIG. 4D). Preferably, the pellicle 100 has a maximum possible height in order to prevent image formation of a foreign object, with the upper limit of 2.5 mm for the reason caused by the exposure device. According to known information, the pellicle 100 needs to be at least 2 mm high (e.g., Carmen Zoldesi, et al., "Progress on EUV Pellicle development", Proceedings of SPIE, 2014.02.03, vol. 9048, 90481N). In consideration of the above, the through-hole 121 has such a diameter that, when the pressure is decreased from normal pressure (0.1 MPa) to a vacuum state at the time of exposure ($10^{-4}$ to $10^{-6}$ Pa), suppresses the expansion of the pellicle film 101, by a pressure difference between the inside and the outside of the pellicle 100, to less than 0.5 mm. In this embodiment, since the through-hole 121 is covered with the filter 131, the diameter of the through-hole 121 is set in consideration of the resistance of the filter 131.

Figure 5A:
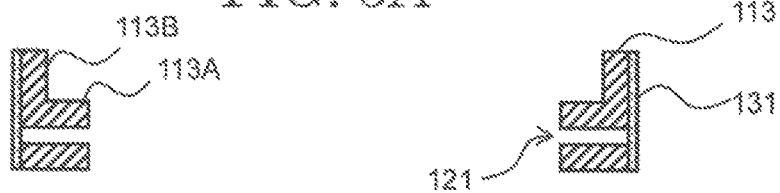
FIG. 5A provides schematic views showing production steps of the pellicle 100 in an embodiment.

The filter 131 covering the through-hole 121 is bonded to the outer surface, of the second frame 113, that is parallel to the height direction of the second frame 113 (FIG. 5A). The filter 131 preferably has the above-described properties, and preferably has a width (height) approximately equal to the height of the second frame 113 in order to guarantee the adhesiveness with the second frame 113.

As described above, the upper limit of the width of the filter 131 is equal to the width (height) of the second frame 113 in order to guarantee the close-adhesiveness of the filter 131 and increase the area size of the filter 131. If the width (height) of the filter 131 exceeds the height of the second frame 113, the bonding portion 137 protrudes from the second frame 113 and thus the close-adhesiveness with the second frame 113 is decreased, which is not preferable.

Figure 5B:
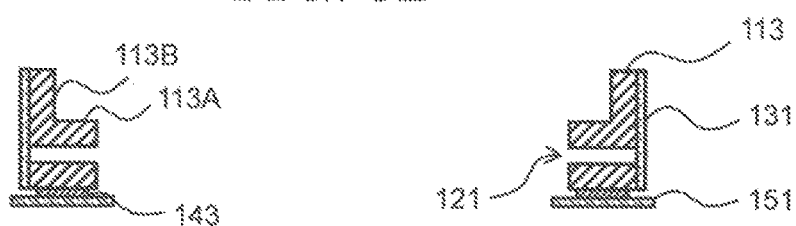
FIG. 5B provides schematic views showing production steps of the pellicle 100 in an embodiment.

The adhesive layer 143 is formed on the bottom surface of the thick portion 115 of the second frame 113. The liner 151 protecting the adhesive layer 143 is also located (FIG. 5B). In this step, the liner 151 having the adhesive layer 143 formed thereon may be prepared and bonded to the bottom surface of the thick portion 115 of the second frame 113 such that the liner 151 is bonded to the thick portion 115 with the adhesive layer 143.

Figure 5C:
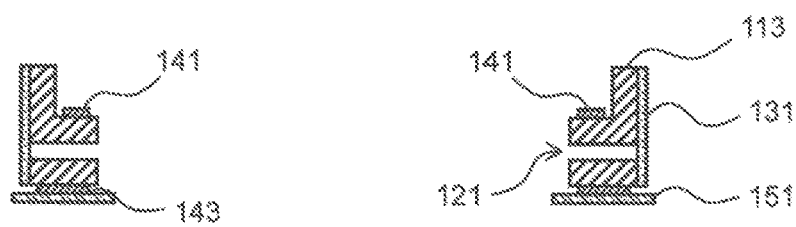
FIG. 5C provides schematic views showing production steps of the pellicle 100 in an embodiment.
Figure 5D:
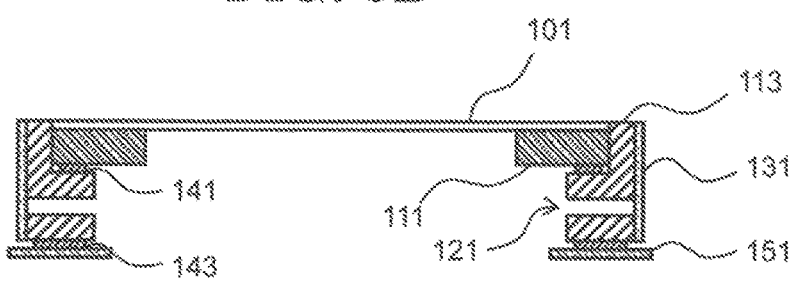
FIG. 5D provides schematic views showing production steps of the pellicle 100 in an embodiment.

The adhesive layer 141 is formed on the first surface 113A of the thick portion 115 of the second frame 113 (FIG. 5C). The first frame 111 is secured to the second frame 113 with the formed adhesive layer 141 such that the second frame 113 encloses the first frame 111 (FIG. 5D). In this step, in order to reinforce the adhesive layer 141, another adhesive layer may be located between, for example, the side surface of the first frame 111 and the second surface 113B of the thin portion 117 of the second frame 113, the second surface 113B being in contact with the side surface of the first frame 111. The space for attaching the pellicle to the photomask has a height of merely 2.5 mm. Therefore, in this embodiment, it is preferable that the total of the height of the second frame 113 and the height of the adhesive layer 143 located on the bottom surface of the second frame 113 is 2 mm or less.

According to the present invention, the second frame 113 is formed of a member having an L-shaped cross-section, and the height of the filter 131 and the height of the second frame 113 are made approximately equal to each other. Thus, the filter 131 is located with a sufficient close-adhesiveness with no gap, other than the through-hole 121, being formed in the rear surface of the filter 131. In addition, the side surface of the first frame 111 is perpendicular to the surface on which the pellicle film 101 is located, and the second surface 113B, which is the inner surface of the thin portion 117 of the second frame 113 and is engaged with the first frame 111, is perpendicular to the first surface 113A of the second frame 113. For such a structure, the first frame 111 and the second frame 113 have a high close-adhesiveness to each other.

Figure 6:
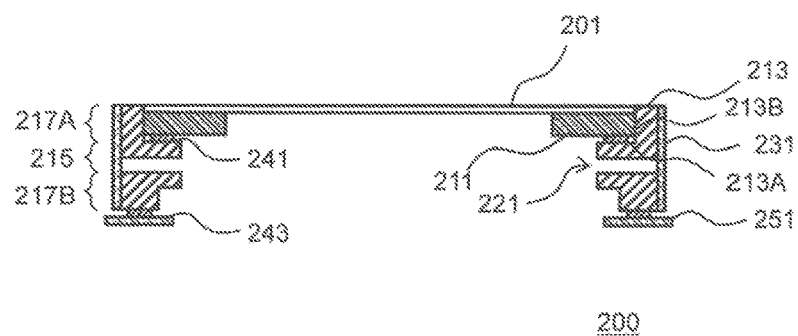
FIG. 6 is a cross-sectional view of a pellicle 200 in an embodiment, taken along line A-A' in FIG. 1.

Regarding the pellicle 100 in this embodiment, the side surface of the first frame 111 merely needs to be perpendicular to the surface on which the pellicle film 101 is located. The second frame 113 merely needs to include the thick portion 115 including the first surface 113A carrying the surface of the first frame 111 opposite to the surface on which the pellicle film 101 is located, also to include the second surface 113B connected with the first surface 113A and carrying the side surface of the first frame 111, and to enclose the pellicle film 101 and the first frame 111. The second surface 113b, engaged with the first frame 111, of the second frame 113 merely needs to be perpendicular to the first surface 113A on which the pellicle film 101 is located. Therefore, this embodiment encompasses, for example, a modification such as a pellicle 200 shown in FIG. 6.

Regarding the pellicle 200, a second frame 213 has a shape different from the shape of the second frame 113. The second frame 213 includes a thick portion 215 including a first surface 213A carrying a surface of a first frame 211 opposite to a surface on which a pellicle film 201 is located, and also includes a second surface 213B connected with the first surface 213A and carrying a side surface of the first frame 211. The second frame 213 encloses the pellicle film 201 and the first frame 211. The second frame 213 includes a first thin portion 217A in contact with the side surface of the first frame 211 and also includes a second thin portion 217B connected with a bottom surface of the thick portion 215 and including a bottom surface of the second frame 213. Therefore, the second frame 213 has a shape of T lying down. Except for the above, the pellicle 200 has substantially the same structure as that of the pellicle 100, and will not be described in detail.

(Embodiment 2)

As shown by the pellicle 900 in FIG. 17B, in the case where the first frame 111 is formed by wet etching, the side surface of the first frame 911 is inclined, and the first frame 911 has a trapezoidal cross-section. In this case, if the second frame 113 shown in embodiment 1 is used, a gap is formed between the side surface of the first frame and the inner surface of the second frame. In this embodiment, an example in which a second frame suitable to a first frame formed by wet etching is used will be described.

Figure 7:
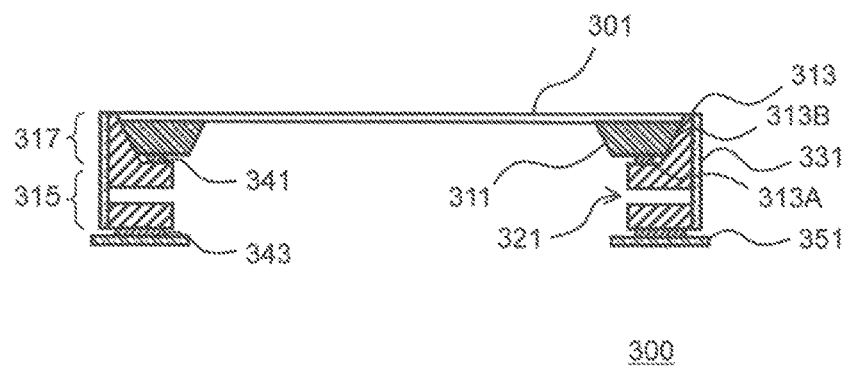
FIG. 7 is a cross-sectional view of a pellicle 300 in an embodiment, taken along line A-A' in FIG. 1.

FIG. 7 is a cross-sectional view of a pellicle 300 in an embodiment according to the present invention, taken along line A-A' in FIG. 1. The pellicle 300 includes a first frame 311 having a pellicle film 301 located thereon and a second frame 313 securing the first frame 311. The second frame 313 includes a thick portion 315 including a first surface 313A carrying a surface of the first frame 311 opposite to a surface on which the pellicle film 301 is located, and also includes a second surface 313B connected with the first surface 313A and carrying a side surface of the first frame 311. The second frame 313 encloses the pellicle film 301 and the first frame 311. The second frame 313 has a generally L-shaped cross-section perpendicular to the pellicle film 301. The pellicle 300 also has a through-hole 321 provided in the second frame 313 and a filter 331 covering the through-hole 321. The through-hole 321 is provided in the thick portion 315 of the second frame 313. The thick portion 315 of the second frame 313 is thick in a direction crossing the surface of the first frame 311 on which the pellicle film 301 is located. The filter 331 is located on an outer side surface, of the second frame 313, that crosses the surface of the first frame 311 on which the pellicle film 301 is located, via an adhesive layer (not shown).

In this embodiment, the first frame 311 is formed by wet etching. Therefore, the side surface of the first frame 311 is inclined, and the first frame 311 has a trapezoidal cross-section. For this reason, the second frame 313 engaged with the first frame 311 has the following structure. The inner surface, of the second frame 313, that crosses the surface of the first frame 311 on which the pellicle film 301 is located is inclined inward with respect to the surface of the first frame 311 on which the pellicle film 301 is located. Namely, a thick portion 317 of the second frame 313 has a generally L-shaped cross-section with an inclining side that has a small width on the side of a top surface and a large width on the side of the thick portion 315.

Regarding the pellicle 300, the inner surface, of the second frame 313, that is engaged with the first frame 311 and crosses the surface of the first frame 311 on which the pellicle film 301 is located, is inclined inward with respect to the surface of the first frame 311 on which the pellicle film 301 is located. For such a structure, the second frame 313 has a high close-adhesiveness with the first frame 311 formed by wet etching.

The pellicle film 301, the first frame 311 and the second frame 313 may be formed of any of substantially the same materials as those of the pellicle film, the substrate and the second frame 113 described above, and the materials will not be described in detail.

The first frame 311 and the second frame 313 are secured to each other with an adhesive layer 341. In FIG. 7, the adhesive layer 341 is located on the first surface 313A of the thick portion 315 of the second frame 313. The thick portion 315 is thick in the direction crossing the surface of the first frame 311 on which the pellicle film 301 is located. In order to reinforce the adhesive layer 341, another adhesive layer may be provided between, for example, the side surface (inclining surface) of the first frame 311 and the second surface 313B, which is a side surface of the thin portion 317 of the second frame 313 and is in contact with the side surface (inclining surface) of the first frame 311.

Preferably, the adhesive layer 341 has a minimum possible thickness that guarantees a sufficient adhesiveness between the first frame 311 and the second frame 313. For example, the adhesive layer 341 has a thickness of 10 µm or greater and 300 µm or less. The adhesive layer 341 is preferably formed of any of substantially the same materials as those of the adhesive layer 141, and the materials will not be described in detail.

The through-hole 321 is provided in the thick portion 315 of the second frame 313. The thick portion 315 of the second frame 313 is thick in the direction crossing the surface of the first frame 311 on which the pellicle film 301 is located. Preferably, the pellicle 300 has a maximum possible height in order to prevent image formation of a foreign object, with the upper limit of 2.5 mm for the reason caused by the exposure device. According to known information, the pellicle needs to be at least 2 mm high (e.g., Carmen Zoldesi, et al., "Progress on EUV Pellicle development", Proceedings of SPIE, 2014.02.03, vol. 9048, 90481N). In consideration of the above, the through-hole 321 has such a diameter that, when the pressure is decreased from normal pressure (0.1 MPa) to a vacuum state at the time of exposure ($10^{-4}$ to $10^{-6}$ Pa), suppresses the expansion of the pellicle film 301, by a pressure difference between the inside and the outside of the pellicle 300, to less than 0.5 mm. In this embodiment, since the through-hole 321 is covered with the filter 331, the diameter of the through-hole 321 is set in consideration of the upper limit of the pressure loss caused at the through-hole 321 when the pressure is decreased.

The pressure loss caused at the through-hole 321 when the pressure is decreased is desirably 1 Pa or less, more desirably 0.5 Pa or less. In the case where, for example, the pressure is decreased at a rate of 350 Pa/sec., when the pressure loss caused at the through-hole 321, i.e., the pressure difference between the inside and the outside of the pellicle 300, is 1 Pa, the number of the through-holes 321 is 4 and the diameter of each through-hole 321 is 480 µm.

The through-holes 321 may have any shape with no specific limitation, and may be circular, elliptical, rectangular, polygonal, trapezoidal or the like. There is no specific limitation on the diameter of the through-holes 321, but it is desirable that the through-holes 321 each have a diameter of about 10 to 500 µm as long as the strength of the frame is not decreased. There is no specific limitation on the number of the through-holes 321, and the number of the through-holes 321 may be selected in accordance with the length or the width of the filter 331.

The filter 331 may be formed of any of substantially the same materials as those of the filter 131, and the materials will not be described in detail. Preferably, the filter 331 has a width (height) that is approximately equal to that of the second frame 313 in order to guarantee the adhesiveness with the second frame 313.

Like the filter 131, the filter 331 includes a gas passage portion and a bonding portion (not shown). The bonding portion is provided along the periphery of the filter so as to encompass the gas passage portion. The bonding portion has a role of bonding the second frame and the gas passage portion to each other with no gap. The bonding portion does not pass gas. The bonding portion has a width of 0.2 mm or greater and 1.0 mm or less. In order to increase the area size of the gas passage portion, the bonding portion is desirably as thin as possible.

The gas passage portion refers to a portion of the filter that is not covered with the bonding portion. Gas passes the gas passage portion and particles contained in the gas are captured. Since the pressure loss is caused at the gas passage portion, the ventilation performance of the filter is determined by the ventilation performance of the gas passage portion.

The total area size of the gas passage portion of the filter 331 is set in consideration of the upper limit of the pressure loss caused at the gas passage portion of the filter 331 when the pressure is decreased. The pressure loss caused at the gas passage portion of the filter 331 when the pressure is decreased is desirably 2 Pa or less. The length of the gas passage portion of the filter 331 is calculated by dividing the area size of the gas passage portion of the filter 331 by the width of the gas passage portion of the filter 331. There is no specific limitation on the length per filter. The length is desirably 1 cm to 15 cm, more desirably 2 cm to 10 cm.

In this embodiment, the second surface 313B, which is an inner surface of the second frame 313, is engaged with the first frame 311 and crosses the surface of the first frame 311 on which the pellicle film 301 is located, is inclined inward with respect to the surface of the first frame 311 on which the pellicle film 301 is located. The first frame 311 has the surface inclined with respect to the surface on which the pellicle film 301 is located, such that the width of the first frame 311 is smaller on the side of the bottom surface. Therefore, the second surface 313B, which is the inner surface of the thin portion 317 of the second frame 313 and is engaged with the first frame 311, is inclined with respect to the first surface 313A of the second frame 313, such that the thin portion 317 has a width increasing toward the side of the thick portion 315. For such a structure, the first frame 311 and the second frame 313 are highly close-adhesive to each other. In this state, the first frame 311 and the second frame 313 are preferably located such that a top surface of the pellicle film 301 and the top surface of the second frame 313 are on the same plane.

An adhesive layer 343 is located on a bottom surface of the thick portion 315 of the second frame 313. The adhesive layer 343 is an element used to secure the pellicle 300 to a photomask. The adhesive layer 343 preferably has a minimum possible thickness that guarantees a sufficient adhesiveness between the photomask and the second frame 315. The thickness of the adhesive layer 343 is, for example, 10 μm or greater and 300 μm or less. The adhesive layer 343 may be formed of any of substantially the same materials as those of the adhesive layer 143, and the materials will not be described in detail.

Regarding the pellicle 300, it is preferable that the total of the height of the second frame 313 and the height of the adhesive layer 343 located on the bottom surface of the second frame 313 is 2 mm or less. As described above, a space for attaching the pellicle to the photomask has a height of merely 2.5 mm. Therefore, in order to prevent breakage of the pellicle film 301, the height of the pellicle 300 is preferably 2 mm or less.

In order to prevent dust or the like from being attached to the adhesive layer 343 of the pellicle 300 before use, the adhesive layer 343 is protected by a peelable liner 351.

According to the present invention, the second frame 313 is formed of a member having a generally L-shaped cross-section, and the height of the filter 331 and the height of the second frame 313 are made approximately equal to each other. Thus, the filter 331 is located with a sufficient close-adhesiveness with no gap, other than the through-hole 321, being formed in a rear surface of the filter 331.

(Method for Producing the Pellicle 300)

Figure 8A:
FIG. 8A provides schematic views showing production steps of the pellicle 300 in an embodiment.

The pellicle 300 in this embodiment may be produced by, for example, a method described below with reference to FIGS. 8A to 8D and FIGS. 9A to 9D. The following production process is an example, and the order of production steps may be changed when necessary. FIGS. 8A to 8D and FIGS. 9A to 9D show the production steps of the pellicle 300. A substrate 305 is prepared, and the pellicle film 301 is formed on the substrate 305 (FIG. 8A). As described above, the substrate 305 may be a silicon substrate, a sapphire substrate, a silicon carbide substrate or the like, but is not limited to any of these.

The pellicle film 301 is formed by vapor deposition on the substrate 305 so as to have a thickness of 20 nm or greater and 50 nm or less. EUV light is easily absorbed to any substance. Therefore, it is preferable that the pellicle film 301 is formed to be thin so as to have a transmittance of 90.0% or greater with respect to light having a wavelength of 5 nm or longer and 30 nm or shorter. The pellicle film 301 according to the present invention has a transmittance of 90.0% or greater with respect to light having a wavelength of, preferably, about 5 nm to about 13.5 nm, more preferably 13.5±0.3 nm.

Figure 8B:
FIG. 8B provides schematic views showing production steps of the pellicle 300 in an embodiment.

The substrate 305 having the pellicle film 301 formed thereon is wet-etched such that the substrate 305 is frame-shaped to expose the pellicle film 301. Thus, the first frame 311 is formed (FIG. 8B). The side surface of the first frame 311 formed by wet etching is inclined to have a width increasing toward the surface on which the pellicle film 301 is formed. The first frame 311 has a trapezoidal cross-section.

Figure 8C:
FIG. 8C provides schematic views showing production steps of the pellicle 300 in an embodiment.

Separately from the above, the second frame 313 having a generally L-shaped cross-section in a height direction is prepared (FIG. 8C). In this embodiment, the second surface 313B, which is the inner side surface of the thin portion 317 of the second frame 313, is inclined such that the thin portion 317 is wider at the first surface 313A on the side of the thick portion 315 than at the top surface. Namely, the second surface 313B, which is the inner surface of the second frame 313 and crosses the surface of the first frame 311 on which the pellicle film 301 is located, is inclined inward with respect to the surface of the first frame 311 on which the pellicle film 301 is formed.

Figure 8D:
FIG. 8D provides schematic views showing production steps of the pellicle 300 in an embodiment.

The through-hole 321 is formed in the thick portion 315, which is thick in the direction crossing the height direction of the second frame 313 (FIG. 8D). Preferably, the pellicle 300 has a maximum possible height in order to prevent image formation of a foreign object, with the upper limit of 2.5 mm for the reason caused by the exposure device. According to known information, the pellicle 300 needs to be at least 2 mm high (e.g., Carmen Zoldesi, et al., "Progress on EUV Pellicle development", Proceedings of SPIE, 2014.02.03, vol. 9048, 90481N). In consideration of the above, the through-hole 321 has such a diameter that, when the pressure is decreased from normal pressure (0.1 MPa) to a vacuum state at the time of exposure ($10^{-4}$ to $10^{-6}$ Pa), suppresses the expansion of the pellicle film 301, by a pressure difference between the inside and the outside of the pellicle 300, to less than 0.5 mm. In this embodiment, since the through-hole 321 is covered with the filter 331, the diameter of the through-hole 321 is set in consideration of the resistance of the filter 331.

Figure 9A:
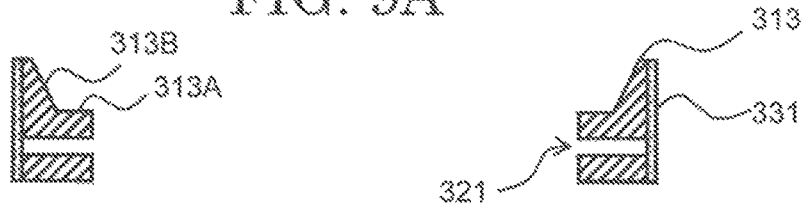
FIG. 9A provides schematic views showing production steps of the pellicle 300 in an embodiment.

The filter 331 covering the through-hole 321 is attached to the outer surface, of the second frame 313, that is parallel to the height direction of the second frame 313 (FIG. 9A). The filter 331 preferably has the above-described properties, and preferably has a width (height) approximately equal to the height of the second frame 313 in order to guarantee the adhesiveness with the second frame 313.

As described above, the upper limit of the width of the filter 331 is equal to the width (height) of the second frame 313 in order to guarantee the close-adhesiveness of the filer 331 and increase the area size of the filter 331. If the width (height) of the filter 331 exceeds the height of the second frame 313, the bonding portion protrudes from the second frame 313 and thus the close-adhesiveness with the second frame 313 is decreased, which is not preferable.

Figure 9B:
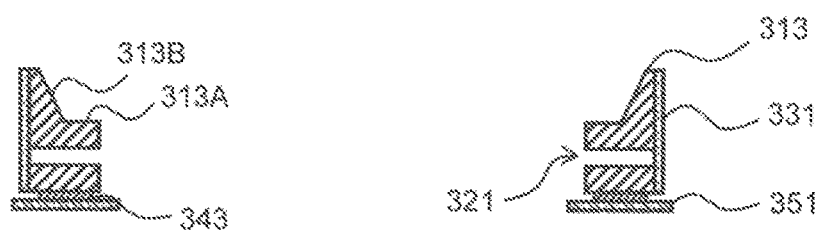
FIG. 9B provides schematic views showing production steps of the pellicle 300 in an embodiment.

The adhesive layer 343 is formed on the bottom surface of the thick portion 315 of the second frame 313. The liner 351 protecting the adhesive layer 343 is also located (FIG. 9B). In this step, the liner 351 having the adhesive layer 343 formed thereon may be prepared and bonded to the bottom surface of the thick portion 315 of the second frame 313 such that the liner 351 is bonded to the thick portion 315 with the adhesive layer 343.

Figure 9C:
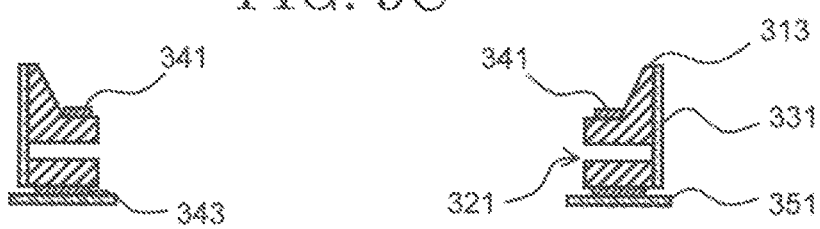
FIG. 9C provides schematic views showing production steps of the pellicle 300 in an embodiment.
Figure 9D:
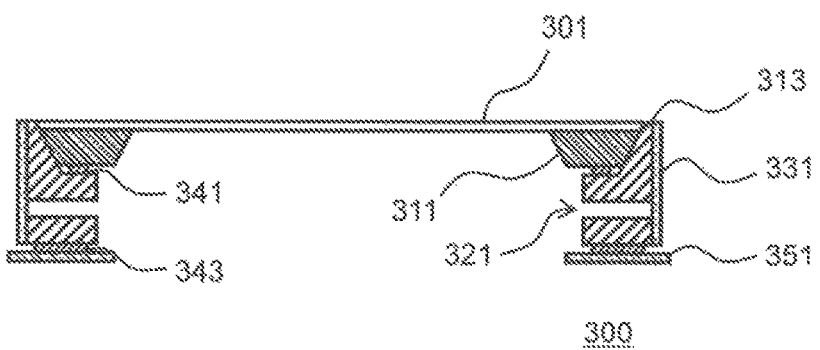
FIG. 9D provides schematic views showing production steps of the pellicle 300 in an embodiment.

The adhesive layer 341 is formed on the first surface 313A of the thick portion 315 of the second frame 313 (FIG. 9C). The first frame 311 is secured to the second frame 313 with the formed adhesive layer 341 such that the second frame 313 encloses the first frame 311 (FIG. 9D). In this step, in order to reinforce the adhesive layer 341, another adhesive layer may be located between, for example, the side surface (inclining surface) of the first frame 311 and the second surface 313B, which is the side surface (inclining surface) of the thin portion 317 of the second frame 313 and is in contact with the side surface (inclining surface) of the first frame 311.

According to the present invention, the second frame 313 is formed of a member having a generally L-shaped cross-section, and the height of the filter 331 and the height of the second frame 313 are made approximately equal to each other. Thus, the filter 331 is located with a sufficient close-adhesiveness with no gap, other than the through-hole 321, being formed in the rear surface of the filter 331. In addition, the second surface 313B, which is the inner surface of the second frame 313, is engaged with the first frame 311 and crosses the surface of the first frame 311 on which the pellicle film 301 is located, is inclined inward with respect to the surface of the first frame 311 on which the pellicle film 301 is located. For such a structure, the second frame 313 has a high close-adhesiveness with the first frame 311, which is formed by wet etching.

Regarding the pellicle 300 in this embodiment, the side surface of the first frame 311 merely needs to be inclined with respect to a bottom surface thereof. The second frame 313 merely needs to include the thick portion 315 including the first surface 313A carrying the surface of the first frame 311 opposite to the surface on which the pellicle film 301 is located, also to include the second surface 313B connected with the first surface 313A and carrying the side surface of the first frame 311, and to enclose the pellicle film 301 and the first frame 311. The second surface 313B, engaged with the first frame 311, of the second frame 313 merely needs to be inclined with respect to the surface of the first frame 311 on which the pellicle film 301 is located. Therefore, this embodiment encompasses, for example, a modification such as a pellicle 400 shown in FIG. 10.

Regarding the pellicle 400, a second frame 413 has a shape different from the shape of the second frame 313. The second frame 413 includes a thick portion 415 including a first surface 413A carrying a surface of a first frame 411 opposite to a surface on which a pellicle film 401 is located, and also includes a second surface 413B connected with the first surface 413A and carrying a side surface of the first frame 411. The second frame 413 encloses the pellicle film 401 and the first frame 411. The second frame 413 includes a first thin portion 417A in contact with the side surface of the first frame 411 and also includes a second thin portion 417B connected with a bottom surface of the thick portion 415 and including a bottom surface of the second frame 413.

Figure 10:
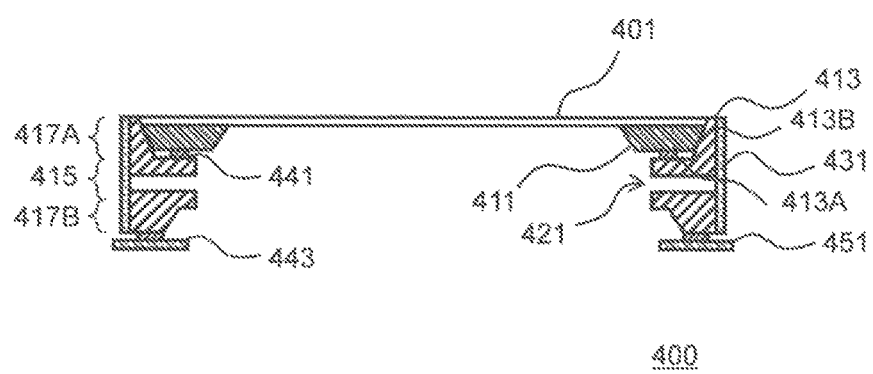
FIG. 10 is a cross-sectional view of a pellicle 400 in an embodiment, taken along line A-A' in FIG. 1.

In FIG. 10, the second thin portion 417B of the second frame 413 is inclined toward an outer side surface of the second frame 413 and the bottom surface thereof. In another modification, an inner side surface of the second thin portion 417B may be parallel to the outer side surface of the second frame 413, like in the second frame 213 of the pellicle 200 described above.

The second frame 213 of the pellicle 200 in the above-described modification of embodiment 1 may have the surface inclined toward the outer side surface of the second frame 413 and the bottom surface thereof, like the second thin portion 417B of the second frame 413.

(Embodiment 3)

In the above-described embodiments, the second frame, namely, the first surface and the second surface of the second frame, enclose the pellicle film and the first frame, and the first frame is secured to the second frame with the adhesive layer. The pellicle according to the present invention is operated as follows. Extreme ultraviolet light passes the pellicle film and is incident on the photomask attached to the photomask, and the incident extreme ultraviolet light is output as extreme ultraviolet light of a pattern of the photomask, or stray light generated as a result of high-order reflection or diffused reflection. If the extreme ultraviolet light incident on, and/or output from, the photomask hits the adhesive layer, the adhesive layer is deteriorated.

Figure 11:
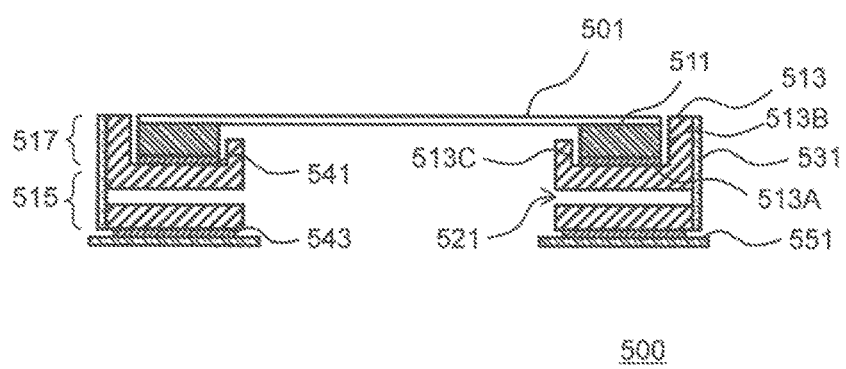
FIG. 11 is a cross-sectional view of a pellicle 500 in an embodiment, taken along line A-A' in FIG. 1.

In this embodiment, a pellicle using a second frame including a third surface connected with the first surface and facing the second surface to suppress the deterioration of the adhesive layer will be described. FIG. 11 is a cross-sectional view of a pellicle 500 in an embodiment according to the present invention, taken along line A-A' in FIG. 1.

The pellicle 500 includes a first frame 511 having a pellicle film 501 located thereon, and a second frame 513 securing the first frame 511. The second frame 513 includes a thick portion 515 including a first surface 513A carrying a surface of the first frame 511 opposite to a surface on which the pellicle film 501 is located, and also includes a second surface 513B connected with the first surface 513A and carrying a side surface of the first frame 511. In this embodiment, the second frame 513 further includes a third surface 513C connected with the first surface 513A and facing the second surface 513B. The third surface 513C of the second frame 513 is located to face an inner side surface of the first frame 511.

The pellicle 500 also has a through-hole 521 provided in the second frame 513 and a filter 131 covering the through-hole 521. The through-hole 521 is provided in the thick portion 515 of the second frame 513. The thick portion 515 of the second frame 513 is thick in a direction crossing the surface of the first frame 511 on which the pellicle film 501 is located. The filter 531 is located on an outer side surface, of the second frame 513, that crosses the surface of the first frame 511 on which the pellicle film 501 is located, via an adhesive layer (not shown).

The pellicle film 501, the first frame 511 and the second frame 513 may be formed of any of substantially the same materials as those of the pellicle film, the substrate and the second frame 113 described above, and the materials will not be described in detail.

The first frame 511 and the second frame 513 are secured to each other with an adhesive layer 541. The adhesive layer 541 is located on the first surface 513A of the thick portion 515 of the second frame 513. The thick portion 515 is thick in the direction crossing the surface of the first frame 511 on which the pellicle film 501 is located. In order to reinforce the adhesive layer 541, another adhesive layer may be provided between, for example, the side surfaces of the first frame 511, and the second surface 513B and the third surface 513C of the thin portion 517, in contact with the side surfaces of the first frame 511, of the second frame 513.

In this embodiment, the second frame 513 includes a protruding portion including the third surface 513C connected with the first surface 513A and facing the second surface 513B. The protruding portion including the third surface 513C blocks extreme ultraviolet light from being incident on, and/or output from, the photomask and thus prevents the extreme ultraviolet light from hitting the adhesive layer 541. Therefore, the deterioration of the adhesive layer 541 by the extreme ultraviolet light is suppressed.

The adhesive layer 541, the through-hole 521 and the filter 531 have the structures described above, and thus will not be described in detail.

A method for producing the pellicle 500 is different from that of the pellicle 100 only in the formation of the second frame 513. Specifically, the second frame 513 is prepared such that the second surface 513B, and the third surface 513C connected with the first surface 513A and facing the second surface 513B, are perpendicular to the surface of the first frame 511 on which the pellicle film 501 is formed. The first frame 511 is secured to the second frame 513 with the adhesive layer 541. Except for the above, the method for producing the pellicle 500 is substantially the same as that of the pellicle 100, and will not be described in detail.

The structure of the second frame including the protruding portion including the third surface may be combined with the first frame formed by wet etching to expose the pellicle film in embodiment 2. FIGS. 12A to 12D provide schematic views of a pellicle 600 in an embodiment. FIG.

12A is a cross-sectional view thereof taken along line A-A' in FIG. 1, and FIG. 12B through FIG. 12D show modifications of a second frame 613.

The pellicle 600 includes a first frame 611 having which a pellicle film located thereon, and a second frame 613 securing the first frame 611. The second frame 613 includes a thick portion 615 including a first surface 613A carrying a surface of the first frame 611 opposite to a surface on which the pellicle film 601 is located, and also includes a second surface 613B connected with the first surface 613A and carrying a side surface of the first frame 611. In this embodiment, the second frame 613 further includes a third surface 613C connected with the first surface 613A and facing the second surface 613B. The third surface 613C of the second frame 613 is located to face an inner side surface of the first frame 611.

The second frame 613 has a generally L-shaped cross-section perpendicular to the pellicle film 601. The pellicle 600 also has a through-hole 621 provided in the second frame 613 and a filter 631 covering the through-hole 621. The through-hole 621 is provided in the thick portion 615 of the second frame 613. The thick portion 615 of the second frame 613 is thick in a direction crossing the surface of the first frame 611 on which the pellicle film 601 is located. The filter 631 is located on an outer side surface, of the second frame 613, that crosses the surface of the first frame 611 on which the pellicle film 601 is located, via an adhesive layer (not shown).

In this embodiment, the first frame 611 is formed by wet etching. Therefore, the side surface of the first frame 611 is inclined, and the first frame 611 has a trapezoidal cross-section. For this reason, the second frame 613 engaged with the first frame 611 has the following structure. The inner surface, of the second frame 613, that crosses the surface of the first frame 611 on which the pellicle film 601 is located is inclined inward with respect to the surface of the first frame 611 on which the pellicle film 601 is located. The third surface 613C, engaged with the first frame 611, of the second frame 613 is inclined from the first surface 613A, such that a distance between the third surface 613C and the second surface 6136 increases toward the surface of the first frame 611 on which the pellicle film 601 is located.

Regarding the pellicle 600, the second frame 613 includes the second surface 613B and the third surface 613C connected with the first surface 613A and inclined such that the distance between the second surface 613B and the third surface 613C increases toward the surface of the first frame 611 on which the pellicle film 601 is located. For this structure, the second frame 613 has a high close-adhesiveness with the first frame 611 formed by wet etching.

In this embodiment, the second frame 613 includes the protruding portion including the third surface 613C, such that the distance between the third surface 613C and the second surface 613B increases toward the surface of the first frame 611 on which the pellicle film 601 is located. The protruding portion including the third surface 613C blocks extreme ultraviolet light from being incident on, and/or output from, the photomask and thus prevents the extreme ultraviolet light from hitting an adhesive layer 641. Therefore, the deterioration of the adhesive layer 641 by the extreme ultraviolet light is suppressed.

The protruding portion including the third surface 613C of the second frame 613 may be modified regarding the shape of a tip portion as shown in FIG. 12B through FIG. 12D. In the pellicle 600 in this embodiment, the tip portion of the protruding portion including the third surface 613C of the second frame 613 may have a cross-section that has an acute angle as shown in FIG. 12B, that is trapezoidal as shown in FIG. 12C, or that is rounded as shown in FIG. 12D. The protruding portion is not limited to any of the above.

A method for producing the pellicle 600 is different from that of the pellicle 300 only in the formation of the second frame 613. Specifically, the second frame 613 is prepared so as to include the second surface 613B inclined inward with respect to the surface of the first frame 611 on which the pellicle film 601 is formed, and to include the third surface 613C inclined, such that the distance between the third surface 613C and the second surface 613B increases toward the surface of the first frame 611 on which the pellicle film 601 is located. The first frame 611 is secured to the second frame 613 with the adhesive layer 641. Except for the above, the method for producing the pellicle 600 is substantially the same as that of the pellicle 300, and will not be described in detail.

In the pellicle 500 and the pellicle 600, the second frame may have the surface inclined toward the outer side surface and the bottom surface thereof, like the second thin portion 417B of the second frame 413. In another modification, an inner side surface of the second thin portion may be parallel to the outer side surface of the second frame, like in the second frame 213 of the pellicle 200 described above.

(Embodiment 4)

In the above-described embodiments, the pellicle film according to the present invention is an unconventionally thin film having a thickness of 20 nm or greater and 50 nm or less. Therefore, it is difficult to secure the pellicle to a photomask like a conventional pellicle. Thus, a dedicated bonding device is needed to bond the pellicle to the photomask in a non-contact manner. In this embodiment, an example in which the second frame includes a bonding element used to bond the pellicle to the photomask in a non-contact manner will be described.

Figure 13:
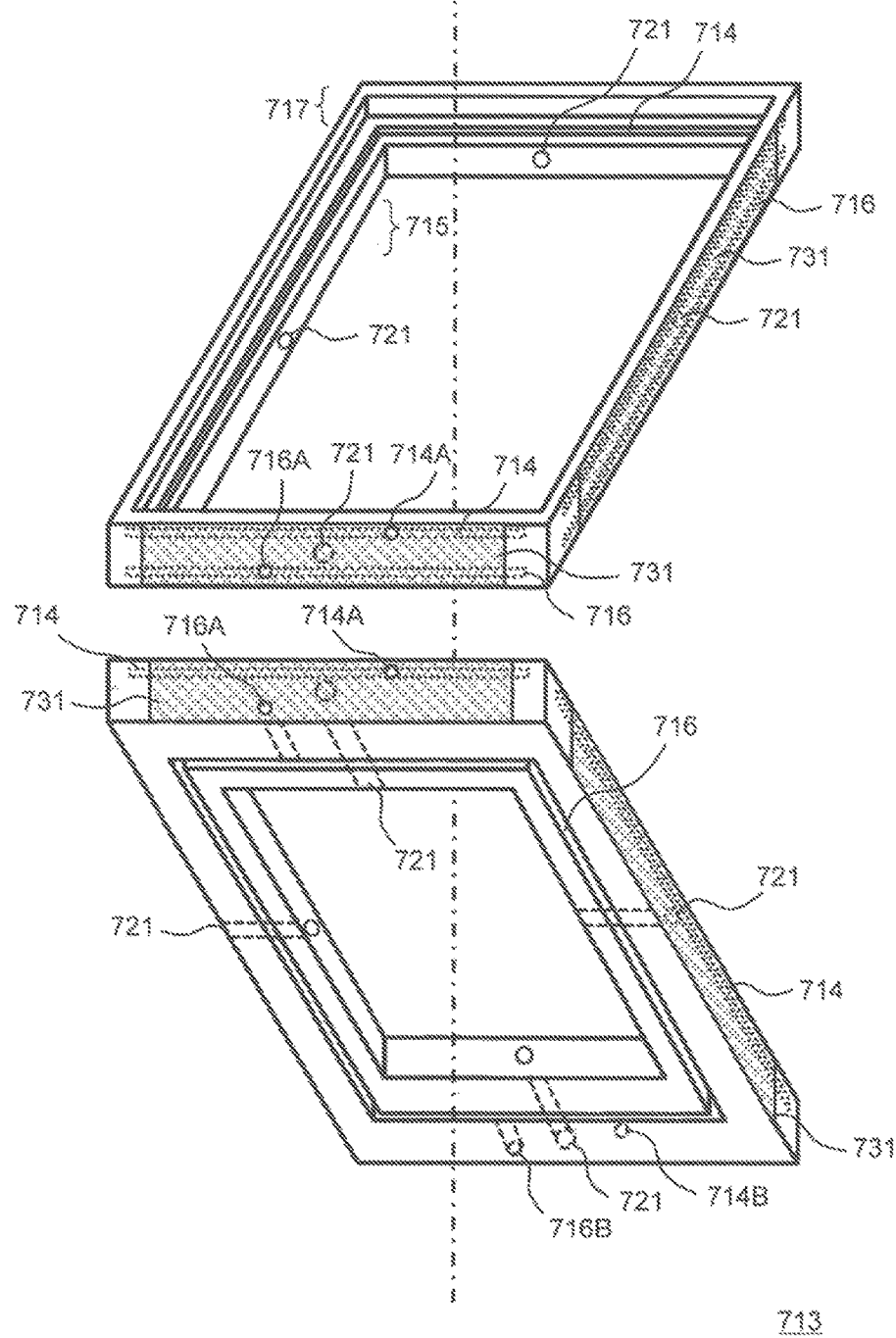
FIG. 13 is a schematic view of a second frame 713 used for a pellicle 700 in an embodiment.
Figure 14:
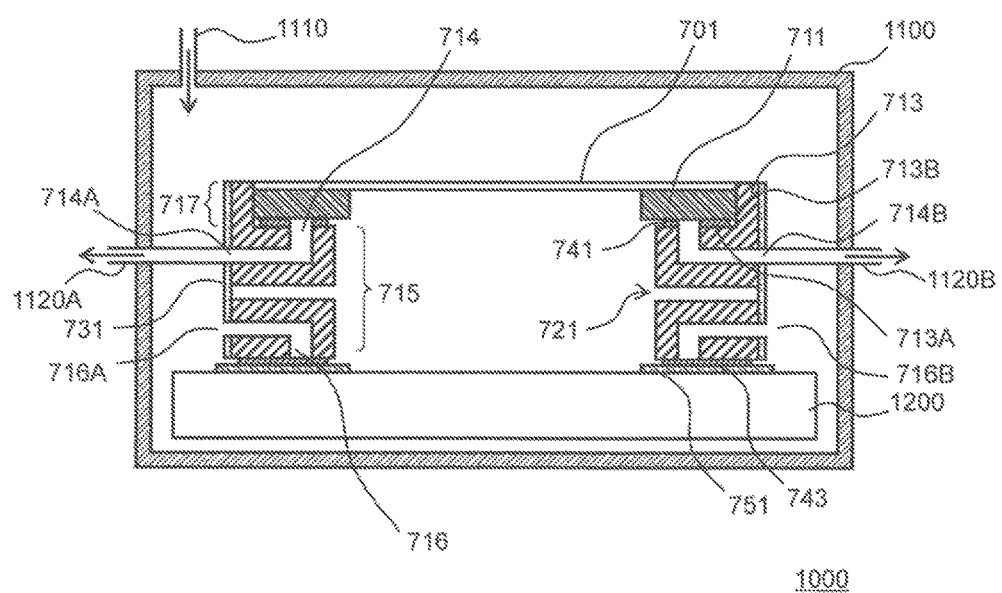
FIG. 14 is a schematic view showing a production process of the pellicle 700 by use of a pellicle production device 1000 in an embodiment.

FIG. 13 is a schematic view of a second frame 713 used for a pellicle 700 in an embodiment according to the present invention. An upper part of the figure shows a perspective view of a top part of the second frame 713, and a lower part of the figure shows a perspective view of a bottom part of the second frame 713. As shown in FIG. 14, the pellicle 700 includes a first frame 711 having a pellicle film 701 located thereon, and a second frame 713 securing the first frame 711. The second frame 713 encloses the pellicle film 701 and the first frame 711, and has an L-shaped cross-section perpendicular to the pellicle film 701. The pellicle 700 also has a through-hole 721 provided in the second frame 713 and a filter 731 covering the through-hole 721. The through-hole 721 is provided in a thick portion 715 of the second frame 713. The thick portion 715 of the second frame 713 is thick in a direction crossing the surface of the first frame 711 on which the pellicle film 701 is located. The filter 731 is located on an outer surface, of the second frame 713, that crosses the surface of the first frame 711 on which the pellicle film 701 is located, via an adhesive layer (not shown).

The second frame 713 has a groove 714 formed in a top surface of the thick portion 715. In this embodiment, as seen from a top surface (in a thick direction) of the second frame 713, the groove 714 has a shape running around the shape of the second frame 713 with no end.

The second frame 713 has a through-hole 714A and a through-hole 714B. The through-hole 714A and the through-hole 714B each run from a bottom surface of the groove 714 through the outer surface of the second frame 713.

The through-holes 714A and 714B may each run from a side surface of the groove 714 through the outer surface of the second frame 713. Alternatively, either one of the through-holes 714A and 714B may be omitted. Namely, in the second frame 713, two through-holes (through-holes 714A and 714B) are in communication with one groove (groove 714), but this embodiment is not limited to having such a structure. In this embodiment, it is sufficient that at least one through-hole is in communication with one groove (groove 714, groove 716).

As shown in FIG. 13 and FIG. 14, the second frame 713 has a groove 716 on a bottom surface of the thick portion 715 opposite to the top surface thereof. In this embodiment, the groove 716 also has a shape running around the shape of the second frame 713 with no end as seen in the thick direction, like the groove 714.

The second frame 713 has a through-hole 716A and a through-hole 716B. The through-hole 716A and the through-hole 716B each run from a bottom surface of the groove 716 through the outer surface of the second frame 713. The through-holes 716A and 716B may have variations substantially the same as those of the through-holes 714A and 714B.

The second frame 713 is preferable to secure (support) the pellicle film 701 and the first frame 711 to produce the pellicle 700. The second frame 713 has the groove 714 in the top surface, of the thick portion 715, facing the first frame 711, and also has the through-holes 714A and 714B in communication with the groove 714. Therefore, for securing the first frame 711 to the thick portion 715 of the second frame 713, the pressure inside the groove 714 is decreased (by, for example, a discharge element such as a vacuum pump or the like) via the through-holes 714A and 714B. Thus, the pressure between the second frame 713 and the first frame 711 is decreased. This depressurization causes a pressing force toward the second frame 713 and the first frame 711. As a result, the second frame 713 and the first frame 711 are secured to each other with no contact with a front surface or a rear surface of the second frame 713 or and the first frame 711 (i.e., the top surface or the bottom surface of the thick portion 715 of the second frame 713, or the surface of the first frame 711 on which the pellicle film 701 is located or a bottom surface of the first frame 711).

The second frame 713 and the first frame 711 are secured to each other with the adhesive layer 741. Since the second frame 713 and the pellicle film are pressed to each other with the adhesive layer 741 by depressurization, the second frame 713 and the first frame 711 are secured to each other firmly.

Except for the above, the pellicle 700 has substantially the same structure as described in embodiments 1 and 2, and will not be described in detail. With reference to FIG. 13 and FIG. 14, an embodiment in which a side surface and the bottom surface of the first frame 711 are approximately perpendicular to each other, like the first frame 111 in embodiment 1. This embodiment is applicable to the second frame engaged with the first frame having an inclining side surface as described in embodiment 2.

(Method for Producing the Pellicle 700)

The steps of the method for producing the pellicle 700 in this embodiment are basically substantially the same as those in embodiments 1 and 2. Like in embodiments 1 and 2, the first frame 711 is formed.

Separately from the above, the second frame 713 having an L-shaped cross-section in the height direction is prepared. In this embodiment, an inner side surface of a thin portion 717 of the second frame 713 is approximately perpendicular to the top surface thereof. Namely, an inner surface, of the second frame 713, that crosses the surface of the first frame 711 on which the pellicle film 701 is located is perpendicular to the surface of the first frame 711 on which the pellicle film 701 is located.

The through-hole 721 is formed in the thick portion 715, which is thick in the direction crossing the height direction of the second frame 713. Preferably, the pellicle 700 has a maximum possible height in order to prevent image formation of a foreign object, with the upper limit of 2.5 mm for the reason caused by the exposure device. According to known information, the pellicle 700 needs to be at least 2 mm high (e.g., Carmen Zoldesi, et al., "Progress on EUV Pellicle development", Proceedings of SPIE, 2014.02.03, vol. 9048, 90481N). In consideration of the above, the through-hole 721 has such a diameter that, when the pressure is decreased from normal pressure (0.1 MPa) to a vacuum state at the time of exposure ($10^{-4}$ to $10^{-6}$ Pa), suppresses the expansion of the pellicle film 701, by a pressure difference between the inside and the outside of the pellicle 700, to less than 0.5 mm. In this embodiment, since the through-hole 721 is covered with the filter 731, the diameter of the through-hole 721 is set in consideration of the resistance of the filter 731.

The groove 714 is formed in the top surface of the thick portion 715 of the second frame 713, and the through-holes 714A and 714B running from the side surface of the groove 714 through the outer surface of the second frame 713 are formed. Similarly, the groove 716 is formed in the bottom surface of the thick portion 715 of the second frame 713, and the through-holes 716A and 716B running from the side surface of the groove 716 through the outer surface of the second frame 713 are formed.

The filter 731 covering the through-hole 721 is bonded to the outer surface, of the second frame 713, that is parallel to the height direction of the second frame 713. The filter 731 preferably has the above-described properties, and preferably has a width (height) approximately equal to the height of the second frame 713 in order to guarantee the adhesiveness with the second frame 713.

Like the filter 131, the filter 731 includes a gas passage portion and a bonding portion (not shown). The bonding portion is provided along the periphery of the filter so as to cover the gas passage portion. The bonding portion has a role of bonding the second frame and the gas passage portion to each other with no gap. The bonding portion does not pass gas. The bonding portion has a width of 0.2 mm or greater and 1.0 mm or less. In order to increase the area size of the gas passage portion, the bonding portion is preferably as thin as possible.

The gas passage portion refers to a portion of the filter that is not covered with the bonding portion. Gas passes the gas passage portion and particles contained in the gas are captured. Since the pressure loss is caused at the gas passage portion, the ventilation performance of the filter is determined by the ventilation performance of the gas passage portion.

An adhesive layer 743 is formed on the bottom surface of the thick portion 715 of the second frame 713. In this step, the adhesive layer 743 is formed so as not to cover the groove 716 formed in the bottom surface of the thick portion 715 of the second frame 713. A liner 751 protecting the adhesive layer 743 is also located. In this step, the liner 751 having the adhesive layer 743 formed thereon may be prepared and bonded to the bottom surface of the thick portion 715 of the second frame 713 such that the liner 751 is bonded to the thick portion 715 with the adhesive layer 743.

The adhesive layer 741 is formed on the top surface of the thick portion 715 of the second frame 713. In this step, the adhesive layer 741 is formed so as not to cover the groove 714 formed in the top surface of the thick portion 715 of the second frame 713. The first frame 711 is secured to the second frame 713 with the formed adhesive layer 741 such that the second frame 713 encloses the first frame 711. In this step, in order to reinforce the adhesive layer 741, another adhesive layer may be located between, for example, the side surface of the first frame 711 and the thin portion 717, in contact with the side surface of the first frame 711, of the second frame 713. The space for attaching the pellicle to the photomask has a height of merely 2.5 mm. Therefore, in this embodiment, it is preferable that the total of the height of the second frame 713 and the height of the adhesive layer 743 located on the bottom surface of the second frame 713 is 2 mm or less.

The step of securing the first frame 711 to the second frame 713 is performed by use of, for example, a pellicle production device 1000 shown in FIG. 14. The pellicle production device 1000 includes a vacuum chamber 1100, a table 1200 located in the vacuum chamber 1100, a supply tube 1110 usable to supply gas to the vacuum chamber 1100, and discharge tubes 1120A and 1120B usable to discharge the gas in the vacuum chamber 1100 to the outside of the vacuum chamber 1100. Ends (not shown), of the discharge tubes 1120A and 1120B, that are outside the vacuum chamber 1100 are connected with a discharge element (not shown) such as a vacuum pump or the like.

On the table 1200 in the vacuum chamber 1100, the second frame 713 is placed. In more detail, the second frame 713 is placed such that the liner 751 of the second frame 713 is in contact with the table 1200. On the adhesive layer 741 of the second frame 713, an assembly of the pellicle film 701 and the first frame 711 is located.

In an example, the assembly includes the first frame 711, which is a silicon wafer (e.g., 8-inch silicon wafer), and the pellicle film 701, which is a polycrystalline silicon film (p-Si film). At a predetermined position in the assembly, a cut is provided to be used to cut the first frame 711 into a predetermined size. Preferably, the first frame 711 is cut into a predetermined size before being bonded with the second frame 713 (hereinafter, this operation will be referred to also as "trimming").

The discharge tubes 1120A and 1120B have ends thereof in the vacuum chamber 1100. These ends are connectable into the two through-holes 714A and 714B provided to depressurize the inside of the groove 714 of the second frame 713.

Hereinafter, an example of method for producing the pellicle by use of the pellicle production device 1000 will be described. First, on the table 1200 in the vacuum chamber 1100, the second frame 713 is placed. The first frame 711 is located above the second frame 713. On this stage, the adhesive layer and the first frame 711 are not put into contact with each other.

Next, the second frame 713 and the first frame 711 are positioned by a known measure. The positioning is performed such that the first frame 711 is fit into an opening enclosed by the second frame 713. Next, the ends of the discharge pipes 1120A and 1120B are respectively connected into the two through-holes 714A and 714B provided to depressurize the inside of the groove 714 of the second frame 713 (frame main body).

Next, gas is supplied from the supply tube 1110 to the vacuum chamber 1100 to pressurize the inside of the vacuum chamber 1100. At the same time, the vacuum pump (not shown) connected to the ends of the discharge tubes 1120A and 1120B outside the vacuum chamber 1100 is actuated to depressurize the inside of the groove 714 provided in the top surface of the thick portion 715 of the second frame 713, via the discharge tubes 1120A and 1120B and the two through-holes 714A and 714B of the second frame 713. The degree of pressurization and depressurization is adjusted such that the pressing force toward the first frame 711 and the second frame 713 (force applied to the entirety of the second frame 713), which is caused by a difference between the entire inner pressure of the vacuum chamber 1100 and the inner pressure of the groove 714 (differential pressure), is, for example, about 2 N. The above-described differential pressure causes the pressing force toward the first frame 711 and the second frame 713, and the adhesive layer 741 of the second frame 713 and the first frame 711 are bonded to each other.

As described above, the first frame 711 and the second frame 713 are secured to each other with no contact with the front surface or the rear surface of the second frame 713 or the first frame 711. The order of the operations may be exchanged appropriately.

(Method for Locating the Pellicle on the Photomask)

A method for locating the pellicle on the photomask in this embodiment, includes, for example, a locating step of locating the pellicle 700 in this embodiment having the groove 716 formed in the surface, of the second frame 713, opposite to at least the surface of the first frame 711 on which the pellicle film 701 is located, and a photomask, such that the surface of the second frame 713 in which the groove 716 is provided faces the photomask; and a securing step of securing the pellicle 700 and the photomask to each other by depressurizing the inside of the groove 716 via the through-holes 716A and 716B.

With the method for locating the pellicle on the photomask in this embodiment, the depressurization of the inside of the groove 716 causes a pressing force toward the pellicle 700 and the photomask. Therefore, the pellicle 700 and the photomask are secured to each other with no contact with a front surface or a rear surface of the pellicle 700 or the photomask.

In the method for locating the pellicle on the photomask in this embodiment, the depressurization in the securing step is preferably performed in a state where the pellicle 700 and the photomask are in a pressurizing atmosphere. In such a state, the difference between the pressure of the entire atmosphere in which the pellicle 700 and the photomask are located, and the inner pressure of the groove 716 (differential pressure) is increased. Therefore, the pressing force toward the pellicle 700 and the photomask is increased. Thus, the pellicle 700 and the photomask are secured to each other more easily.

The pressing force toward the pellicle 700 and the photomask (force applied to the entirety of the second frame 713) is preferably 1 N or greater, and more preferably 2 N or greater. The pressing force toward the pellicle 700 and the photomask (force applied to the entirety of the second frame 713) is still more preferably 10 N or greater, and especially preferably 20 N or greater. There is no specific upper limit on the pressing force toward the pellicle 700 and the photomask (force applied to the entirety of the second frame 713). From the point of view of productivity or the like, the upper limit of the pressing force is, for example, 500 N, preferably 400 N.

Figure 15:
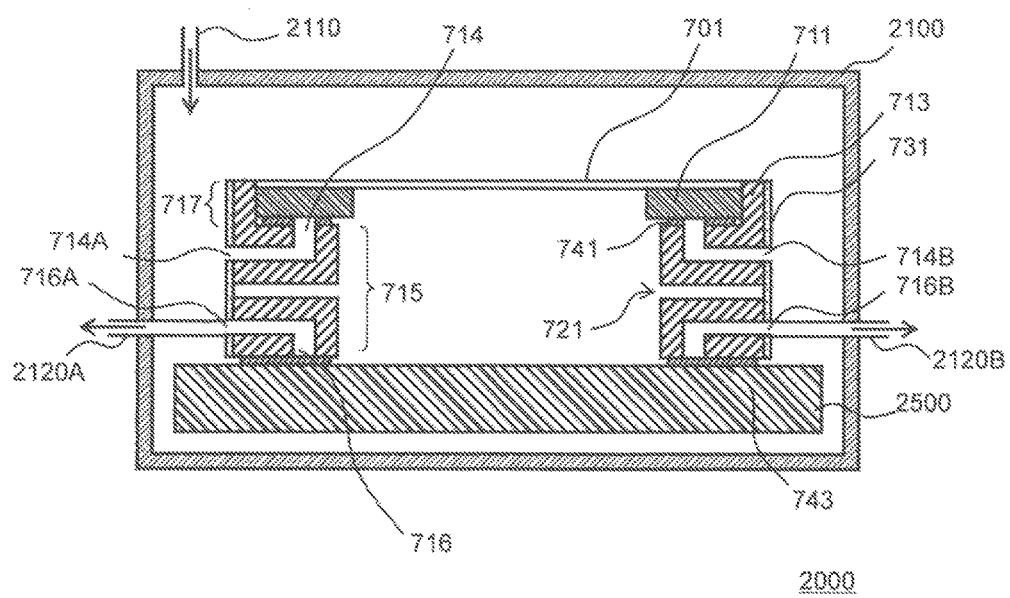
FIG. 15 is a cross-sectional view conceptually showing a photomask production device 2000 in an embodiment.

Now, an example of method for locating the pellicle on the photomask in this embodiment will be described with reference to FIG. 15. It should be noted that the method for locating the pellicle on the photomask in this embodiment is not limited to this example. FIG. 15 is a cross-sectional view conceptually showing an example of photomask production device 2000 preferable for the method for locating the pellicle on the photomask.

The photomask production device 2000 shown in FIG. 15 includes a vacuum chamber 2100, a supply tube 2110 usable to supply gas to the vacuum chamber 2100, and discharge tubes 2120A and 2120B usable to discharge the gas in the vacuum chamber 2100 to the outside of the vacuum chamber 2100. Ends (not shown), of the discharge tubes 2120A and 2120B, that are outside the vacuum chamber 2100 are connected with a discharge element (not shown) such as a vacuum pump or the like.

In the vacuum chamber 2100, a photomask 2500 is located. The photomask 2500 includes a support substrate, a reflective layer stacked on the support substrate, and an absorber layer formed on the reflective layer. The photomask 2500 is located in the vacuum chamber 2100 such that a front surface (light exposure surface; i.e., surface at which the reflective layer and the absorber layer are provided) is directed upward and a rear surface (surface opposite to the light exposure surface; i.e., the surface on the side of the support substrate) is directed downward.

The pellicle 700 deprived of the liner 751 is located above the reflective layer and the absorber layer of the photomask 2500. In more detail, the pellicle 700 is located such that the adhesive 743 faces the front surface (light exposure surface) of the photomask 2500.

The discharge tubes 2120A and 2120B have ends in the vacuum chamber 2100. These ends are connectable into the two through-holes provided to depressurize the inside of the groove 716 provided in the bottom surface of the second frame 713.

Hereinafter, an example of method for locating the pellicle on the photomask by use of the photomask production device 2000 will be described. First, the pellicle 700 in the state where the liner 751 is removed is prepared. Then, the photomask 2500 is located in the vacuum chamber 2100 such that the front surface (light exposure surface) is directed upward. In this step, in order to prevent any foreign object from being attached to the front surface or the rear surface of the photomask 2500, only a side surface, for example, of the photomask 2500 is supported, so that any device, jig or hand does not contact the front surface or the rear surface of the photomask 2500.

Next, the pellicle 7000 is located above the photomask 2500. In this step, in order to prevent any foreign object from being attached to the film surface of the pellicle 700, only the side surface (outer circumferential surface), for example, of the second frame 713 is supported, so that any device, jig or hand does not contact the film surface of the pellicle 700. On this stage, the pellicle 700 is located such that the adhesive layer 743 and the photomask 2500 do not contact each other. Next, the pellicle 700 and the photomask 2500 are positioned by a known measure.

Next, the ends of the discharge tubes 2120A and 2120B are respectively connected into the two through-holes provided to depressurize the inside of the groove 716 on the bottom side of the second frame 713. Next, gas is supplied from the supply tube 2110 to the vacuum chamber 2100 to pressurize the inside of the vacuum chamber. At the same time, the vacuum pump (not shown) connected to the ends of the discharge tubes 2120A and 2120B outside the vacuum chamber 2100 is actuated to depressurize the inside of the groove 716 provided in the bottom surface of the second frame 713, via the discharge tubes 2120A and 2120B and the two through-holes 716A and 716B of the second frame 713. The degree of pressurization and depressurization is adjusted such that the pressing force toward the pellicle 700 and the photomask 2500 (force applied to the entirety of the second frame 713), which is caused by a difference between the entire inner pressure of the vacuum chamber 2100 and the inner pressure of the groove 716 (differential pressure), is, for example, about 2 N. The above-described differential pressure causes the pressing force toward the pellicle 700 and the photomask 2500, and the adhesive layer 743 of the pellicle 700 and the photomask 2500 are bonded to each other.

As described above, the pellicle 700 and the photomask 2500 are bonded to each other with no contact with the front surface or the rear surface of the pellicle 700 or the photomask 2500. Thus, the pellicle 700 and the photomask 2500 are bonded to each other while any foreign object is suppressed from being attached to the pellicle 700 or the photomask 2500. The order of the operations may be exchanged appropriately.

(Modification of the Method for Locating the Pellicle on the Photomask)

In the above-described method for locating the pellicle on the photomask, after the first frame 711 and the second frame 713 are bonded to each other to form the pellicle 700, the pellicle 700 is located on the photomask 2500. The method for locating the pellicle on the photomask according to the present invention is not limited to this. The orders of the operations are exchangeable. An example in which after the second frame is located on the photomask, the first frame is bonded to the second frame to form the pellicle will be described.

In this embodiment, the method for locating the pellicle on the photomask includes a locating step of locating the second frame 713 having the groove 716 formed in the surface opposite to the surface supporting the first frame 711 on which the pellicle film 701 is located, and a photomask, such that the surface, of the second frame 713, in which the groove 716 is provided faces the photomask, a securing step of securing the pellicle 700 and the photomask to each other by depressurizing the inside of the groove 716 via the through-holes 716A and 716B, and a step of securing the first frame 711 having the pellicle film 701 located thereon to the second frame 713.

As described above in embodiment 4, the second frame 713 encloses the pellicle film 701 and the first frame 711, has an L-shaped cross-section perpendicular to the pellicle film 701, and has the through-hole 721 provided in the second frame 713 and includes the filter 713 covering the through-hole 721. The second frame 713 has the groove 714 provided in the top surface of the thick portion 715, the through-holes 714A and 714B running from the bottom surface of the groove 714 through the outer surface of the second frame 713, the groove 716 provided in the bottom surface opposite to the top surface of the thick portion 715, and the through-holes 716A and 716B running from the bottom surface of the groove 716 through the outer surface of the second frame 713.

With the method for locating the pellicle on the photomask in this embodiment, the depressurization of the inside of the groove 716 causes a pressing force toward the second frame 713 and the photomask. Therefore, the second frame 713 and the photomask are secured to each other with the adhesive layer 743 with no contact with the front surface or the rear surface of the second frame 713 or the photomask.

In the method for locating the pellicle on the photomask in this embodiment, the depressurization in the step of securing the second frame 713 is preferably performed in a state where the second frame 713 and the photomask are in a pressurizing atmosphere. In such a state, the difference between the pressure of the entire atmosphere in which the second frame 713 and the photomask are located, and the inner pressure of the groove 716 (differential pressure) is increased. Therefore, the pressing force toward the second frame 713 and the photomask is increased. Thus, the second frame 713 and the photomask are secured to each other more easily.

The pressing force toward the second frame 713 and the photomask is preferably 1 N or greater, and more preferably 2 N or greater. The pressing force toward the second frame 713 and the photomask is still more preferably 10 N or greater, and especially preferably 20 N or greater. There is no specific upper limit on the pressing force toward the second frame 713 and the photomask. From the point of view of productivity or the like, the upper limit of the pressing force is, for example, 500 N, preferably 400 N.

The pressure between the second frame 713 and the first frame 711 is decreased by depressurizing the inside of the groove 714 (by, for example, a discharge element such as a vacuum pump or the like) via the through-holes 714A and 714B. The depressurization causes a pressing force toward the second frame 713 and the first frame 711. As a result, the first frame 711 and the second frame 713 are secured to each other with no contact with the front surface or the rear surface of the second frame 713 or the first frame 711 (i.e., the top surface or the bottom surface of the thick portion 715 of the second frame 713, or the surface of the first frame 711 on which the pellicle film 701 is located or a bottom surface of the first frame 711).

The second frame 713 and the first frame 711 are secured to each other with the adhesive layer 741. Since the second frame 713 and the pellicle film are pressed to each other with the adhesive layer 741 by depressurization, the second frame 713 and the first frame 711 are secured to each other firmly.

Figure 16A:
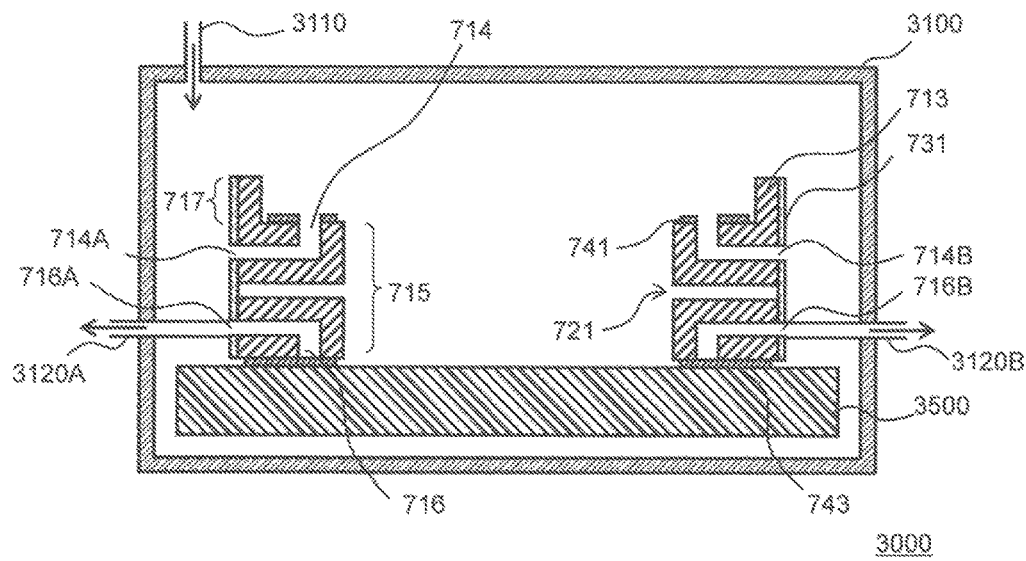
FIG. 16A provides cross-sectional views conceptually showing a photomask production device 3000 in an embodiment.
Figure 16B:
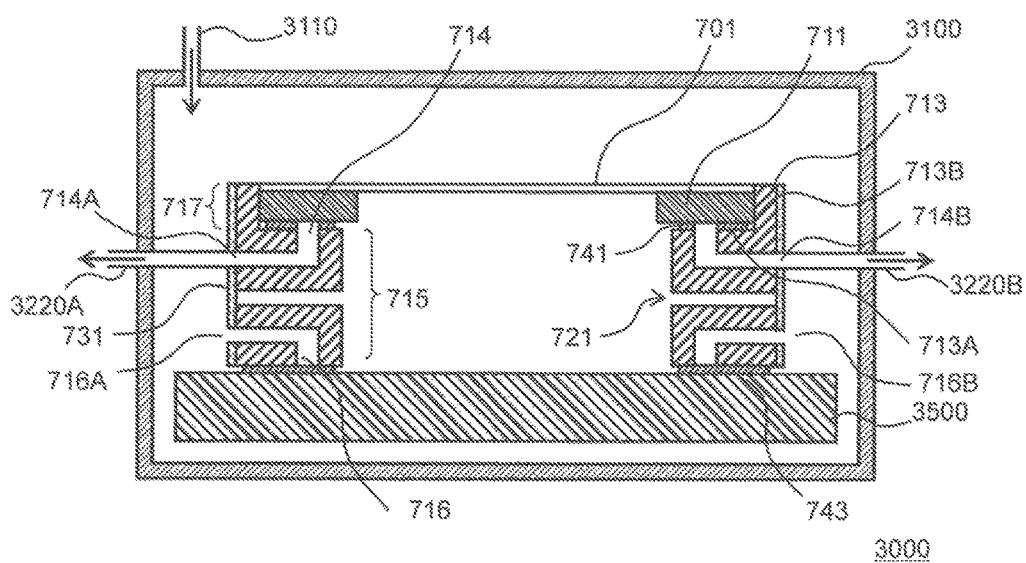
FIG. 16B provides cross-sectional views conceptually showing a photomask production device 3000 in an embodiment.

Now, a modification of the method for locating the pellicle on the photomask in this embodiment will be described with reference to FIGS. 16A and 16B. It should be noted that the method for locating the pellicle on the photomask in this embodiment is not limited to this example. FIGS. 16A and 16B provide cross-sectional views conceptually showing an example of photomask production device 3000 preferable for the method for locating the pellicle on the photomask.

The photomask production device 3000 shown in FIGS. 16A and 16B include a vacuum chamber 3100, a supply tube 3110 usable to supply gas to the vacuum chamber 3100, and discharge tubes 3120A and 3120B usable to discharge the gas in the vacuum chamber 3100 to the outside of the vacuum chamber 3100. Ends (not shown), of the discharge tubes 3120A and 3120B, that are outside the vacuum chamber 3100 are connected with a discharge element (not shown) such as a vacuum pump or the like.

In the vacuum chamber 3100, a photomask 3500 is located. The photomask 3500 includes a support substrate, a reflective layer stacked on the support substrate, and an absorber layer formed on the reflective layer. The photomask 3500 is located in the vacuum chamber 3100 such that a front surface (light exposure surface; i.e., surface at which the reflective layer and the absorber layer are provided) is directed upward and a rear surface (surface opposite to the light exposure surface; i.e., the surface on the side of the support substrate) is directed downward.

The second frame 713 deprived of the liner 751 is located above the reflective layer and the absorber layer of the photomask 3500. In more detail, the second frame 713 is located such that the adhesive 743 faces the front surface (light exposure surface) of the photomask 3500.

The discharge tubes 3120A and 3120B have ends in the vacuum chamber 3100. These ends are connectable into the two through-holes provided to depressurize the inside of the groove 716 provided in the bottom surface of the second frame 713.

Hereinafter, an example of method for locating the pellicle on the photomask by use of the photomask production device 3000 will be described. First, the second frame 713 in the state where the liner 751 is removed is prepared. Then, the photomask 3500 is located in the vacuum chamber 3100 such that the front surface (light exposure surface) is directed upward. In this step, in order to prevent any foreign object from being attached to the front surface or the rear surface of the photomask 3500, only a side surface, for example, of the photomask 3500 is supported, so that any device, jig or hand does not contact the front surface or the rear surface of the photomask 3500.

Next, the second frame 713 is located above the photomask 3500. On this stage, the second frame 713 is located such that the adhesive layer 743 and the photomask 3500 do not contact each other. Next, the second frame 713 and the photomask 3500 are positioned by a known measure.

Next, the ends of the discharge tubes 3120A and 3120B are respectively connected into the two through-holes provided to depressurize the inside of the groove 716 on the bottom side of the second frame 713. Next, gas is supplied from the supply tube 3110 to the vacuum chamber 3100 to pressurize the inside of the vacuum chamber 3100. At the same time, the vacuum pump (not shown) connected to the ends of the discharge tubes 3120A and 3120B outside the vacuum chamber 3100 is actuated to depressurize the inside of the groove 716 provided in the bottom surface of the second frame 713, via the discharge tubes 3120A and 3120B and the two through-holes 716A and 716B of the second frame 713. The degree of pressurization and depressurization is adjusted such that the pressing force toward the second frame 713 and the photomask 3500, which is caused by a difference between the entire inner pressure of the vacuum chamber 3100 and the inner pressure of the groove 716 (differential pressure), is, for example, about 2 N. The above-described differential pressure causes the pressing force toward the second frame 713 and the photomask 3500, and the adhesive layer 743 of the pellicle 700 and the photomask 3500 are bonded to each other.

Next, the first frame 711 is located above the second frame 713. On this stage, the first frame 711 is located such that the adhesive layer 741 and the first frame 711 do not contact each other. Next, the second frame 713 and the first 711 are positioned by a known measure. The positioning is performed such that the first frame 711 is fit into an opening enclosed by the second frame 713. Next, ends of discharge pipes 3220A and 3220B are respectively connected into the two through-holes 714A and 714B provided to depressurize the inside of the groove 714 of the second frame 713 (frame main body).

Next, gas is supplied from the supply tube 3110 to the vacuum chamber 3100 to pressurize the inside of the vacuum chamber 3100. At the same time, the vacuum pump (not shown) connected to ends of the discharge tubes 3220A and 3220B outside the vacuum chamber 3100 is actuated to depressurize the inside of the groove 714 provided in the top surface of the thick portion 715 of the second frame 713, via the discharge tubes 3220A and 3220B and the two through-holes 714A and 714B of the second frame 713. The degree of pressurization and depressurization is adjusted such that the pressing force toward the first frame 711 and the second frame 713 (force applied to the entirety of the second frame 713), which is caused by a difference between the entire inner pressure of the vacuum chamber 3100 and the inner pressure of the groove 714 (differential pressure), is, for example, about 2 N. The above-described differential pressure causes the pressing force toward the first frame 711 and the second frame 713, and the adhesive layer 741 of the second frame 713 and the first frame 711 are bonded to each other.

As described above, the pellicle 700 and the photomask 3500 are bonded to each other with no contact with the front surface or the rear surface of the pellicle 700 or the photomask 3500. Thus, the pellicle 700 and the photomask 3500 are bonded to each other while any foreign object is suppressed from being attached to the pellicle 700 or the photomask 3500. The order of the operations may be exchanged appropriately.

(Exposure Method)

The pellicle in any of the embodiments described above may be used to realize microscopic processing by extreme ultraviolet lithography. The pellicle according to the present invention is located on a reticle surface of the photomask, and the photomask is located at a predetermined position in the exposure device. The pellicle is accommodated in a gap having a distance of 3 mm or less from the reticle surface. In vacuum, light of 5 nm or longer and 30 nm or shorter is directed toward the photomask having the pellicle located thereon, and light output from the reticle surface of the photomask having the pellicle located thereon is directed toward a substrate on which a resist layer is formed. Thus, a pattern is exposed to the resist layer.

The pellicle film of the pellicle according to the present invention is an unconventionally thin film having a thickness of 20 nm or greater and 50 nm or less. Therefore, it is difficult to secure the pellicle to a photomask like a conventional pellicle. Thus, a dedicated bonding device is needed to bond the pellicle to the photomask in a non-contact manner.

The photomask having the pellicle bonded thereto according to the present invention is located at a predetermined position in the exposure device. The pellicle is accommodated in a gap having a distance of 3 mm or less, especially 2.5 mm, from the reticle surface.

The substrate having the resist layer formed thereon is introduced into the exposure device, and the inside of the exposure device is put into a vacuum state of about $10^{-4}$ to about $10^{-6}$ Pa. At this point, air flows out from the pellicle, according to the present invention, bonded to the photomask. As described above, the pellicle according to the present invention includes the second frame having an L-shaped cross-section, and the height of the filter is made approximately equal to the height of the second frame. Thus, the filter is located with a sufficient adhesiveness with no gap, other than the through-hole, being formed in a rear surface of the filter. Therefore, the inside of the pellicle is put into a vacuum state with no damage on the pellicle film.

Then, EUV light of 5 nm or longer and 30 nm or shorter is directed toward the photomask having the pellicle located thereon. The photomask includes a multi-layer reflective film below the reticle surface. Therefore, the EUV light incident on the reticle surface is reflected by the multi-layer reflective film, and the EUV light reflecting the pattern formed at the absorber at the reticle surface is transmitted from the reticle surface through the pellicle and thus is output.

The light output from the reticle surface of the photomask is directed toward the substrate having a resist layer formed thereon, and thus the pattern is exposed to the resist layer. As a result, unconventionally microscopic processing is realized.

The present invention provides a pellicle for extreme ultraviolet light lithography, a production method thereof, and an exposure method. The present invention also provides a pellicle for extreme ultraviolet light lithography that is bondable to a photomask in a non-contact manner, and a production method thereof.

The present invention provides a pellicle for extreme ultraviolet light lithography that alleviates deterioration of an adhesive layer caused by extreme ultraviolet light, a production method thereof, and an exposure method.

The invention claimed is:

1. A pellicle, comprising:
   a pellicle film having a transmittance of 90.0% or greater with respect to light having a wavelength of 5 nm or longer and 30 nm or shorter, the pellicle film having a thickness of 20 nm or greater and 50 nm or less;
   a first frame directly contacting the pellicle film located thereon;
   a second frame including a thick portion including a first surface carrying a surface of the first frame opposite to a surface on which the pellicle film is located, and also including a second surface connected with the first surface and carrying a side surface of the first frame, the second frame enclosing the pellicle film and the first frame;
   a through-hole provided in the thick portion of the second frame; and
   a filter located on an outer side surface of the second frame and covering the through-hole, the outer side surface crossing the surface of the first frame on which the pellicle film is located, the filter including a gas passage portion and a bonding portion, the bonding portion provided along the periphery of the filter so as to encompass the gas passage portion, the gas passage portion being able to pass gas and capture particles contained in the gas,
   wherein a total of a height of the second frame and a height of an adhesive layer located on a bottom surface of the second frame is less than 2.5 mm, and
   a total area size of the gas passage portion of the filter has a ratio of, with respect to an inner volume of the pellicle, 0.007 mm$^{-1}$ or greater and 0.026 mm$^{-1}$ or less.

2. The pellicle according to claim 1, wherein the second surface, engaged with the first frame, of the second frame is perpendicular to the surface of the first frame on which the pellicle film is located.

3. The pellicle according to claim 1, wherein the second surface, engaged with the first frame, of the second frame is inclined inward with respect to the surface of the first frame on which the pellicle film is located.

4. The pellicle according to claim 1, wherein:
   the second frame further includes a third surface connected with the first surface and facing the second surface;
   the second, first and third surfaces combine to form a groove;
   the first frame sits into the groove; and
   the third surface of the second frame is located to face an inner side surface of the first frame.

5. The pellicle according to claim 4, wherein the third surface, engaged with the first frame, of the second frame is perpendicular to the surface of the first frame on which the pellicle film is located.

6. The pellicle according to claim 4, wherein the third surface, engaged with the first frame, of the second frame is inclined such that a distance between the third surface and the second surface increases toward the surface of the first frame on which the pellicle film is located.

7. The pellicle according to claim 1, wherein the first frame and the thick portion of the second frame are bonded to each other with an adhesive layer.

8. The pellicle according to claim 1, wherein the first frame is formed of a material selected from the group consisting of silicon, sapphire and silicon carbide.

9. An exposure method, comprising:
locating a pellicle according to claim 1 on a reticle surface of a photomask;
locating the photomask at a predetermined position in an exposure device and causing the pellicle to be accommodated in a gap having a distance of 3 mm or less from the reticle surface;
directing, in vacuum, light having a wavelength of 5 nm or longer and 30 nm or shorter toward the photomask having the pellicle located thereon; and
exposing light output from the reticle surface of the photomask having the pellicle located thereon toward a substrate having a resist layer formed thereon.

10. A method for producing a pellicle, comprising:
forming a pellicle film on a substrate, the pellicle film having a transmittance of 90.0% or greater with respect to light having a wavelength of 5 nm or longer and 30 nm or shorter, the pellicle film having a thickness of 20 nm or greater and 50 nm or less;
shaping the substrate into a frame to expose the pellicle film, thereby forming a first frame, the first frame directly contacting the pellicle film;
preparing a second frame including a thick portion including a first surface carrying a surface of the first frame opposite to a surface on which the pellicle film is located, and also including a second surface connected with the first surface and carrying a side surface of the first frame;
forming a through-hole in the thick portion in the second frame;
bonding a filter covering the through-hole on an outer surface of the second frame, the outer surface being parallel to a height direction of the second frame the filter including a gas passage portion and a bonding portion, the bonding portion provided along the periphery of the filter so as to encompass the gas passage portion, the gas passage portion being able to pass gas and capture particles contained in the gas; and
securing the first frame to the second frame with an adhesive layer such that the second frame encloses the first frame,
wherein a total of a height of the second frame and a height of an adhesive layer located on a bottom surface of the second frame is less than 2.5 mm, and
a total area size of the gas passage portion of the filter has a ratio of, with respect to an inner volume of the pellicle, 0.007 mm$^{-1}$ or greater and 0.026 mm$^{-1}$ or less.

11. The method for producing a pellicle according to claim 10, wherein:
the pellicle film is exposed by dry etching,
the second frame including the second surface perpendicular to the surface of the first frame on which the pellicle film is formed is prepared, and
the first frame is secured to the second frame with the adhesive layer.

12. The method for producing a pellicle according to claim 10, wherein:
the pellicle film is exposed by wet etching,
the second frame including the second surface inclined inward with respect to the surface of the first frame on which the pellicle film is formed is prepared, and
the first frame is secured to the second frame with the adhesive layer.

13. The method for producing a pellicle according to claim 10, wherein:
the pellicle film is exposed by dry etching,
the second frame including the second surface and a third surface connected with the first surface and facing the second surface is prepared, the second surface and the third surface being perpendicular to the surface of the first frame on which the pellicle film is formed, the second, first and third surfaces combining to form a groove into which the first frame sits, and
the first frame is secured to the second frame with the adhesive layer.

14. The method for producing a pellicle according to claim 10, wherein:
the pellicle film is exposed by wet etching,
the second frame including the second surface and a third surface is prepared, the second surface being inclined inward with respect to the surface of the first frame on which the pellicle film is formed, the third surface being inclined such that a distance between the third surface and the second surface increases toward the surface of the first frame on which the pellicle film is located, the second, first and third surfaces combining to form a groove into which the first frame sits, and
the first frame is secured to the second frame with the adhesive layer.

15. The method for producing a pellicle according to claim 10, wherein the first frame is selected from the group consisting of a silicon substrate, a sapphire substrate and a silicon carbide substrate.

* * * * *